US012687930B2

(12) United States Patent
Glad et al.

(10) Patent No.: US 12,687,930 B2
(45) Date of Patent: Jul. 21, 2026

(54) AIR FLOW DISSIPATION OPENING OF A HAPTIC ACTUATOR

(71) Applicant: Cirque Corporation, Sandy, UT (US)

(72) Inventors: Paul Glad, Sandy, UT (US); Douglas Steck, Riverton, UT (US)

(73) Assignee: Cirque Corporation, Sandy, UT (US)

( * ) Notice: Subject to any disclaimer, the term of this patent is extended or adjusted under 35 U.S.C. 154(b) by 934 days.

(21) Appl. No.: 17/977,318

(22) Filed: Oct. 31, 2022

(65) Prior Publication Data

US 2024/0143079 A1     May 2, 2024

(51) Int. Cl.
G06F 3/01          (2006.01)
H10N 30/20        (2023.01)

(52) U.S. Cl.
CPC ............. G06F 3/016 (2013.01); H10N 30/20 (2023.02)

(58) Field of Classification Search
CPC ...... H10N 30/20; H10N 30/206; H10N 30/88; G06F 3/016
See application file for complete search history.

(56) References Cited

U.S. PATENT DOCUMENTS

| 7,602,384 | B2 | 10/2009 | Rosenberg | |
| 10,289,199 | B2 | 5/2019 | Hoellwarth | |
| 2021/0144884 | A1* | 5/2021 | Mou .................... | H10N 30/875 |
| 2021/0168229 | A1* | 6/2021 | Kallman .............. | G06F 1/1643 |
| 2021/0168231 | A1* | 6/2021 | Baker .................... | H05K 1/189 |
| 2024/0112599 | A1* | 4/2024 | Moskowitz ........... | B64U 10/13 |

* cited by examiner

*Primary Examiner* — Emily P Pham

(57)          ABSTRACT

An apparatus may include a substrate in a capacitance module, a first cavity in the substrate, a first housing in the cavity, a piezoelectric haptic actuator in the housing, and a dissipation opening defined in the housing that increases air flow from the first cavity to the outside of the apparatus.

19 Claims, 21 Drawing Sheets

1400a

1400b

1600

1601

1601      1604

1602

1601

1603

3300

3306

3302

3301

3305

3304

3303

3300

3306

3302

3301

3305

AIR FLOW DISSIPATION OPENING OF A HAPTIC ACTUATOR

FIELD OF THE DISCLOSURE

This disclosure relates generally to systems and methods for haptic actuators. In particular, this disclosure relates to systems and methods for embedding haptic actuators within capacitance modules, other types of modules, wearable devices, gaming devices, electric devices, other types of devices, or combinations thereof.

BACKGROUND

Haptic actuators may be incorporated into electric devices, such as touchpads, touchscreens, gaming devices, and wearables. The haptic actuators in such devices may be used to generate vibration feedback.

An example of a haptic feedback system is disclosed in U.S. Pat. No. 10,289,199 issued to Quin C. Hoellwarth. This reference discloses a system for localized haptic feedback at discrete locations or regions of a surface. Controllable haptic transmission nodes can be selectively controlled to transmit a haptic feedback signal to a surface. The nodes can be controlled between a first state that transmits the haptic feedback signal to the surface and a second state that dampens or prevents the haptic feedback signal to the surface. The nodes can be located around the perimeter of the surface, where each node can be associated with a particular location or region of the surface and can provide haptic feedback to that particular location or region when the node is selected. A touch surface of a touch sensitive device is an exemplary surface for using localized haptic feedback.

An example of a haptic feedback touchpad is disclosed in U.S. Pat. No. 7,602,384 issued to Louis B. Rosenberg, et al. This reference discloses a haptic feedback planar touch control used to provide input to a computer. A touch input device includes a planar touch surface that inputs a position signal to a processor of the computer based on a location of user contact on the touch surface. The computer can position a cursor in a displayed graphical environment based at least in part on the position signal or perform a different function. At least one actuator is also coupled to the touch input device and outputs a force to provide a haptic sensation to the user contacting the touch surface. The touch input device can be a touchpad separate from the computer's display screen or can be a touch screen. Output haptic sensations on the touch input device can include pulses, vibrations, and spatial textures. The touch input device can include multiple different regions to control different computer functions.

Each of these references are herein incorporated by reference for all that they disclose.

SUMMARY

In one embodiment, an apparatus may be a housing with a first cavity defined in the material of the housing, a piezoelectric actuator mounted within the first cavity, and a dissipation opening defined in the material of the housing that increases air flow from the cavity.

The apparatus may be a capacitance module.

The housing may be located within a layer of the capacitance module.

The housing may be a substrate in the capacitance module.

The housing may be attached to a rigid structure of the capacitance module.

The piezoelectric actuator may be configured to generate a haptic vibration, wherein the haptic vibration may vibrate throughout the material of the housing.

The air flowing through the dissipation opening may have the effect of reducing pressure in the housing.

Reducing pressure in the housing may have the effect of increasing the amplitude of the haptic vibration.

The dissipation opening may connect the first cavity to an outside surface of the housing.

The material of the housing may be a substrate, and the dissipation opening may be an open channel in the edge of the substrate.

The material of the housing may be a substrate, and the dissipation opening may be a through passage in the thickness of the substrate.

The apparatus may include a second cavity defined in the material of the housing, and the dissipation opening may connect the first cavity to the second cavity.

The apparatus may include a substrate with a first side and second side, with electrical components on the first side and/or the second side. The location of the housing may be based, in part, on the location of the electrical components on the substrate.

The location of the dissipation opening may be based, in part, on the location of the electrical components on the substrate.

In another embodiment, an apparatus may include a substrate in a capacitance module, a first cavity in the substrate, a first housing the first cavity, a piezoelectric actuator in the housing, and a dissipation opening defined in the housing that increases air flow from the first cavity to the outside of the apparatus.

Increasing air flow may have the effect of increasing the amplitude of a vibration from the piezoelectric actuator.

The apparatus may include a second cavity in the substrate, and the dissipation opening may connect the first cavity to the second cavity.

The dissipation opening may connect the first cavity to another substrate in the capacitance module.

The substrate may be a component layer in the capacitance module.

The substrate may be a shield layer in the capacitance module.

In some embodiments, an apparatus may include a housing, a cavity defined in the material of the housing, a haptic actuator mounted within the cavity, and a dissipation opening defined in the material of the housing that increases air flow from the cavity.

The haptic actuator may be a piezoelectric actuator.

Figure 1:
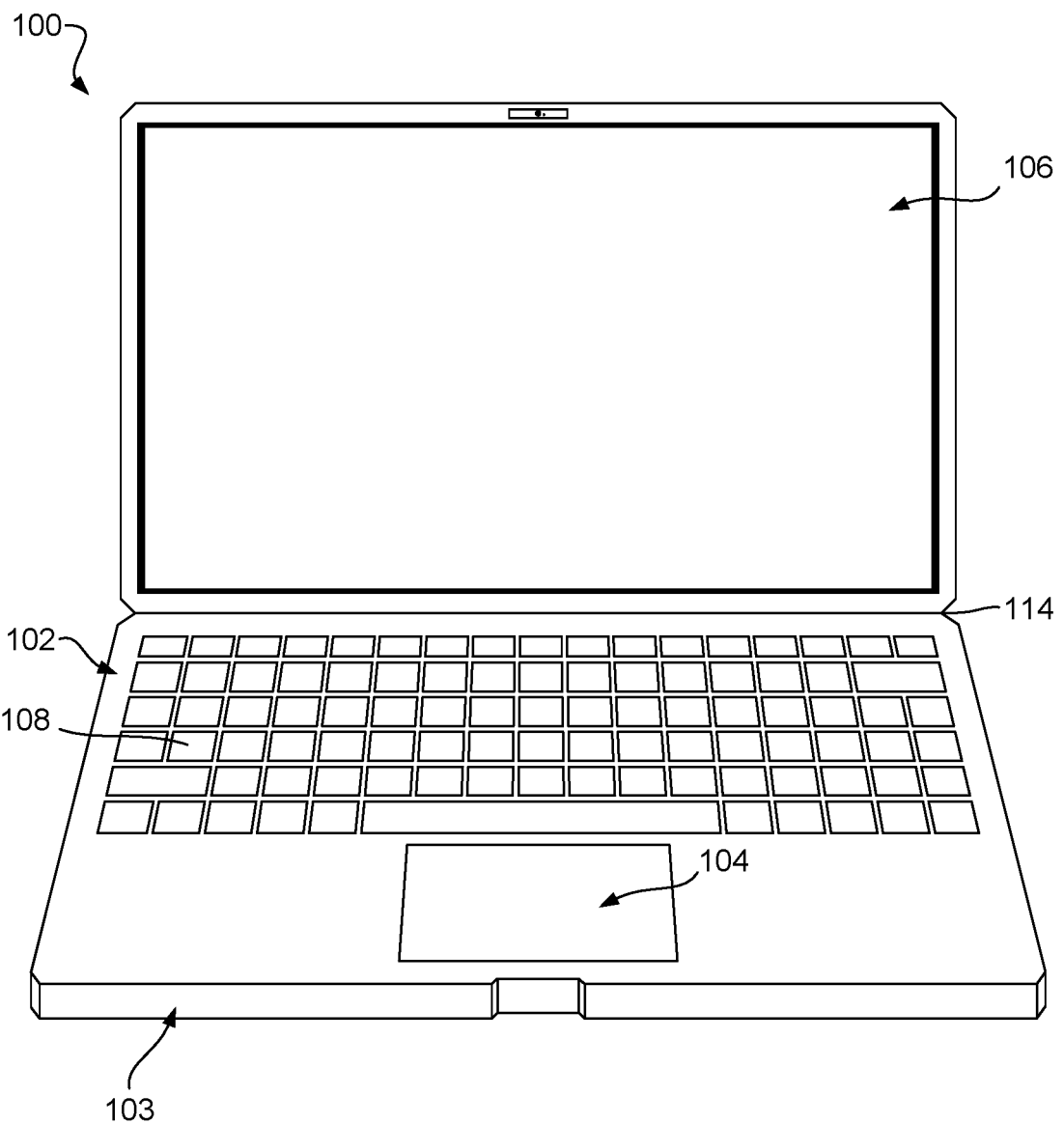
FIG. 1 depicts an example of an electronic device in accordance with the disclosure.

While the disclosure is susceptible to various modifications and alternative forms, specific embodiments have been shown by way of example in the drawings and will be described in detail herein. However, it should be understood that the disclosure is not intended to be limited to the particular forms disclosed. Rather, the intention is to cover all modifications, equivalents and alternatives falling within the spirit and scope of the invention as defined by the appended claims.

DETAILED DESCRIPTION OF THE INVENTION

This description provides examples, and is not intended to limit the scope, applicability or configuration of the invention. Rather, the ensuing description will provide those skilled in the art with an enabling description for implementing embodiments of the invention. Various changes may be made in the function and arrangement of elements.

Thus, various embodiments may omit, substitute, or add various procedures or components as appropriate. For instance, it should be appreciated that the methods may be performed in an order different than that described, and that various steps may be added, omitted, or combined. Also, aspects and elements described with respect to certain embodiments may be combined in various other embodiments. It should also be appreciated that the following systems, methods, devices, and software may individually or collectively be components of a larger system, wherein other procedures may take precedence over or otherwise modify their application.

For purposes of this disclosure, the term "aligned" generally refers to being parallel, substantially parallel, or forming an angle of less than 35.0 degrees. For purposes of this disclosure, the term "transverse" generally refers to perpendicular, substantially perpendicular, or forming an angle between 55.0 and 125.0 degrees. For purposes of this disclosure, the term "length" generally refers to the longest dimension of an object. For purposes of this disclosure, the term "width" generally refers to the dimension of an object from side to side and may refer to measuring across an object perpendicular to the object's length.

For purposes of this disclosure, the term "electrode" may generally refer to a portion of an electrical conductor intended to be used to make a measurement, and the terms "route" and "trace" generally refer to portions of an electrical conductor that are not intended to make a measurement. For purposes of this disclosure in reference to circuits, the term "line" generally refers to the combination of an electrode and a "route" or "trace" portions of the electrical conductor. For purposes of this disclosure, the term "Tx" generally refers to a transmit line, electrode, or portions thereof, and the term "Rx" generally refers to a sense line, electrode, or portions thereof.

For the purposes of this disclosure, the term "electronic device" may generally refer to devices that can be transported and include a battery and electronic components. Examples may include a laptop, a desktop, a mobile phone, an electronic tablet, a personal digital device, a watch, a gaming controller, a gaming wearable device, a wearable device, a measurement device, an automation device, a security device, a display, a vehicle, an infotainment system, an audio system, a control panel, another type of device, an athletic tracking device, a tracking device, a card reader, a purchasing station, a kiosk, or combinations thereof.

It should be understood that use of the terms "capacitance module," "touch pad" and "touch sensor" throughout this document may be used interchangeably with "capacitive touch sensor," "capacitive sensor," "capacitance sensor," "capacitive touch and proximity sensor," "proximity sensor," "touch and proximity sensor," "touch panel," "trackpad," "touch pad," and "touch screen."

It should also be understood that, as used herein, the terms "vertical," "horizontal," "lateral," "upper," "lower," "left," "right," "inner," "outer," etc., can refer to relative directions or positions of features in the disclosed devices and/or assemblies shown in the Figures. For example, "upper" or "uppermost" can refer to a feature positioned closer to the top of a page than another feature. These terms, however, should be construed broadly to include devices and/or assemblies having other orientations, such as inverted or inclined orientations where top/bottom, over/under, above/below, up/down, and left/right can be interchanged depending on the orientation.

It should also be understood that for purposes of this disclosure, the term "face" may generally refer to a side of an object with certain geospatial characteristics. The face of an object may be understood as having edges and corners. For example, if an object is a cube, a "face" of the cube may refer to one of the sides of the cube. The face of a cube may have four edges and four corners. In other examples, the face of a pyramid may refer to any of its five sides, but just one of its sides has four edges and four corners, while the other four sides have three edges and three corners each.

In some cases, the capacitance module is located within a housing of an electronic device. The capacitance module may be underneath this housing and capable of detecting objects outside of the housing. In examples, where the capacitance module can detect changes in capacitance through a housing, the housing is a capacitance reference surface. For example, the capacitance module may be disclosed within a cavity formed by a keyboard housing of a computer, such as a laptop or other type of computing device, and the sensor may be disposed underneath a surface of the keyboard housing. In such an example, the keyboard housing adjacent to the capacitance module is the capacitance reference surface. In some examples, an opening may be formed in the housing, and an overlay may be positioned within the opening. In this example, the overlay is the capacitance reference surface. In such an example, the capacitance module may be positioned adjacent to a backside of the overlay, and the capacitance module may sense the presence of the object through the thickness of the overlay. For the purposes of this disclosure, the term "reference surface" may generally refer to a surface through which a pressure sensor, a capacitance sensor, or another type of sensor is positioned to sense a pressure, a presence, a position, a touch, a proximity, a capacitance, a magnetic property, an electric property, another type of property, or another characteristic, or combinations thereof that indicates an input. For example, the reference surface may be a housing, an overlay, or another type of surface through which the input is sensed. In some examples, the reference surface has no moving parts. In some examples, the reference surface may be made of any appropriate type of material, including, but not limited to, plastics, glass, a dielectric material, a metal, another type of material, or combinations thereof.

For the purposes of this disclosure, the term "haptic actuator" may refer to a structure that can cause a controlled vibration in the housing. The haptic actuator may be a full haptic device or a component of a haptic device. Any appropriate type of haptic device may be used, including, but not limited to, a linear actuator, a linear resonant actuator, an eccentric rotating mass actuator, a piezoelectric actuator, a magnetostrictive actuator, another type of actuator, or combinations thereof.

For the purposes of this disclosure, the term "display" may generally refer to a display or screen that is not depicted in the same area as the capacitive reference surface. In some cases, the display is incorporated into a laptop where a keyboard is located between the display and the capacitive reference surface. In some examples where the capacitive reference surface is incorporated into a laptop, the capacitive reference surface may be part of a touch pad. Pressure sensors may be integrated into the stack making up the capacitance module. However, in some cases, the pressure sensors may be located at another part of the laptop, such as under the keyboard housing, but outside of the area used to sense touch inputs, on the side of the laptop, above the keyboard, to the side of the keyboard, at another location on the laptop, or at another location. In examples where these principles are integrated into a laptop, the display may be pivotally connected to the keyboard housing. The display may be a digital screen, a touch screen, another type of screen, or combinations thereof. In some cases, the display is located on the same device as the capacitive reference surface, and in other examples, the display is located on another device that is different from the device on which the capacitive reference surface is located. For example, the display may be projected onto a different surface, such as a wall or projector screen. In some examples, the reference surface may be located on an input or gaming controller, and the display is located on a wearable device, such as a virtual reality or augmented reality screen. In some cases, the reference surface and the display are located on the same surface, but on separate locations on that surface. In other examples, the reference surface and the display may be integrated into the same device, but on different surfaces. In some cases, the reference surface and the display may be oriented at different angular orientations with respect to each other.

FIG. 1 depicts an example of an electronic device 100. In this example, the electronic device is a laptop. In the illustrated example, the electronic device 100 includes input components, such as a keyboard 102 and a capacitive module, such as a touch pad 104, that are incorporated into a housing 103. The electronic device 100 also includes a display 106. A program operated by the electronic device 100 may be depicted in the display 106 and controlled by a sequence of instructions that are provided by the user through the keyboard 102 and/or through the touch pad 104. An internal battery (not shown) may be used to power the operations of the electronic device 100.

The keyboard 102 includes an arrangement of keys 108 that can be individually selected when a user presses on a key with a sufficient force to cause the key 108 to be depressed towards a switch located underneath the keyboard

102. In response to selecting a key 108, a program may receive instructions on how to operate, such as a word processing program determining which types of words to process. A user may use the touch pad 104 to give different types of instructions to the programs operating on the computing device 100. For example, a cursor depicted in the display 106 may be controlled through the touch pad 104. A user may control the location of the cursor by sliding his or her hand along the surface of the touch pad 104. In some cases, the user may move the cursor to be located at or near an object in the computing device's display and give a command through the touch pad 104 to select that object. For example, the user may provide instructions to select the object by tapping the surface of the touch pad 104 one or more times.

The touch pad 104 is a capacitance module that includes a stack of layers disposed underneath the keyboard housing, underneath an overlay that is fitted into an opening of the keyboard housing, or underneath another capacitive reference surface. In some examples, the capacitance module is located in an area of the keyboard's surface where the user's palms may rest while typing. The capacitance module may include a substrate, such as a printed circuit board or another type of substrate. One of the layers of the capacitance module may include a sensor layer that includes a first set of electrodes oriented in a first direction and a second layer of electrodes oriented in a second direction that is transverse the first direction. These electrodes may be spaced apart and/or electrically isolated from each other. The electrical isolation may be accomplished by deposited at least a portion of the electrodes on different sides of the same substrate or providing dedicated substrates for each set of electrodes. Capacitance may be measured at the overlapping intersections between the different sets of electrodes. However, as an object with a different dielectric value than the surrounding air (e.g., finger, stylus, etc.) approach the intersections between the electrodes, the capacitance between the electrodes may change. This change in capacitance and the associated location of the object in relation to the capacitance module may be calculated to determine where the user is touching or hovering the object within the detection range of the capacitance module. In some examples, the first set of electrodes and the second set of electrodes are equidistantly spaced with respect to each other. Thus, in these examples, the sensitivity of the capacitance module is the same in both directions. However, in other examples, the distance between the electrodes may be non-uniformly spaced to provide greater sensitivity for movements in certain directions.

In some cases, the display 106 is mechanically separate and movable with respect to the keyboard with a connection mechanism 114. In these examples, the display 106 and keyboard 102 may be connected and movable with respect to one another. The display 106 may be movable within a range of 0 degrees to 180 degrees or more with respect to the keyboard 102. In some examples, the display 106 may fold over onto the upper surface of the keyboard 102 when in a closed position, and the display 106 may be folded away from the keyboard 102 when the display 106 is in an operating position. In some examples, the display 106 may be orientable with respect to the keyboard 102 at an angle between 35 to 135 degrees when in use by the user. However, in these examples, the display 106 may be positionable at any angle desired by the user.

In some examples, the display 106 may be a non-touch sensitive display. However, in other examples at least a portion of the display 106 is touch sensitive. In these examples, the touch sensitive display may also include a capacitance module that is located behind an outside surface of the display 106. As a user's finger or other object approaches the touch sensitive screen, the capacitance module may detect a change in capacitance as an input from the user.

While the example of FIG. 1 depicts an example of the electronic device being a laptop, the capacitance sensor and touch surface may be incorporated into any appropriate device. A non-exhaustive list of devices includes, but is not limited to, a desktop, a display, a screen, a kiosk, a computing device, an electronic tablet, a smart phone, a location sensor, a card reading sensor, another type of electronic device, another type of device, or combinations thereof.

Figure 2:
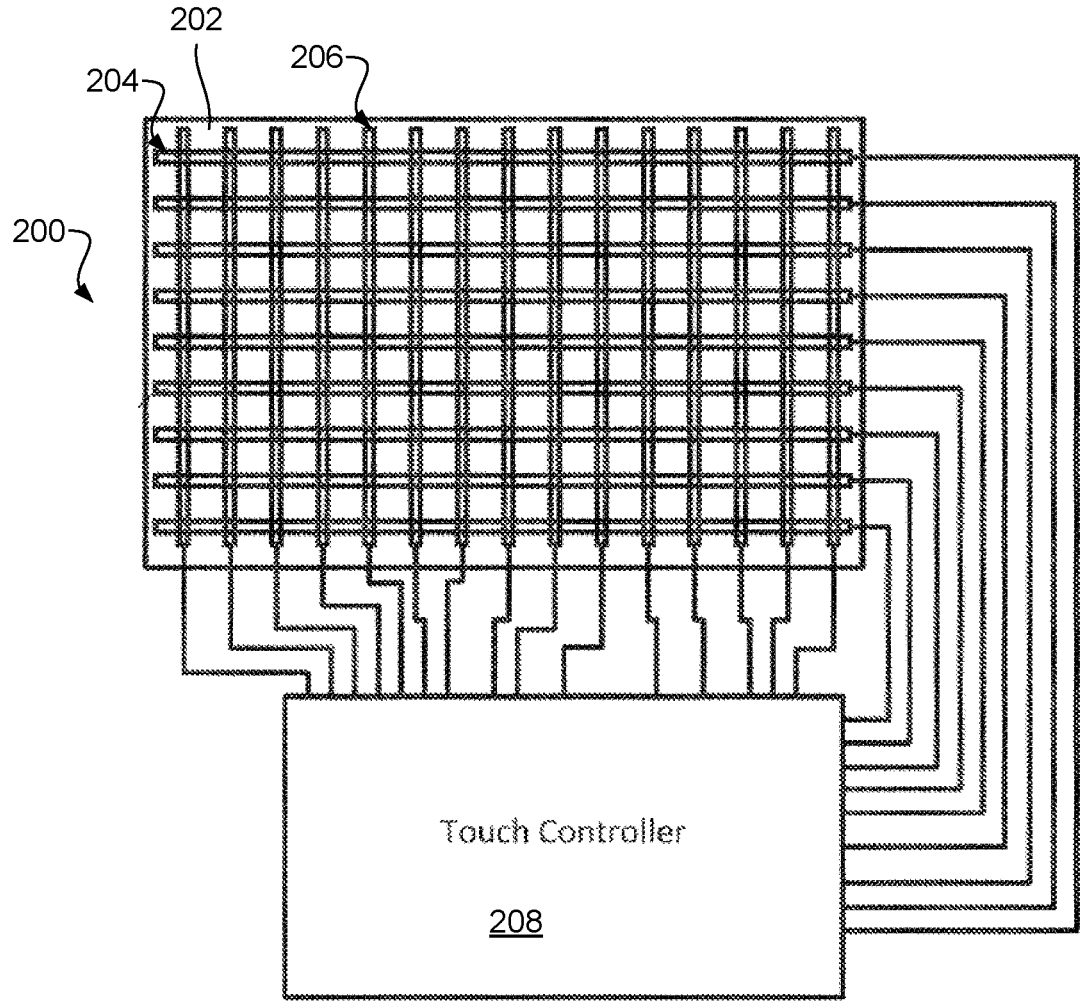
FIG. 2 depicts an example of a substrate with a first set of electrodes and a second set of electrodes in accordance with the disclosure.

FIG. 2 depicts an example of a portion of a capacitance module 200. In this example, the capacitance module 200 may include a substrate 202, first set 204 of electrodes, and a second set 206 of electrodes. The first and second sets 204, 206 of electrodes may be oriented to be transverse to each other. Further, the first and second sets 204, 206 of electrodes may be electrically isolated from one another so that the electrodes do not short to each other. However, where electrodes from the first set 204 overlap with electrodes from the second set 206, capacitance can be measured. The capacitance module 200 may include one or more electrodes in the first set 204 or the second set 206. Such a substrate 202 and electrode sets may be incorporated into a touch screen, a touch pad, a location sensor, a gaming controller, a button, and/or detection circuitry.

In some examples, the capacitance module 200 is a mutual capacitance sensing device. In such an example, the substrate 202 has a set 204 of row electrodes and a set 206 of column electrodes that define the touch/proximity-sensitive area of the component. In some cases, the component is configured as a rectangular grid of an appropriate number of electrodes (e.g., 8-by-6, 16-by-12, 9-by-15, or the like).

As shown in FIG. 2, the capacitance module 208 includes a capacitance controller 208. The capacitance controller 208 may include at least one of a central processing unit (CPU), a digital signal processor (DSP), an analog front end (AFE) including amplifiers, a peripheral interface controller (PIC), another type of microprocessor, and/or combinations thereof, and may be implemented as an integrated circuit, a field programmable gate array (FPGA), an application specific integrated circuit (ASIC), a combination of logic gate circuitry, other types of digital or analog electrical design components, or combinations thereof, with appropriate circuitry, hardware, firmware, and/or software to choose from available modes of operation.

In some cases, the capacitance controller 208 includes at least one multiplexing circuit to alternate which of the sets 204, 206 of electrodes are operating as drive electrodes and sense electrodes. The driving electrodes can be driven one at a time in sequence, or randomly, or drive multiple electrodes at the same time in encoded patterns. Other configurations are possible such as a self-capacitance mode where the electrodes are driven and sensed simultaneously. Electrodes may also be arranged in non-rectangular arrays, such as radial patterns, linear strings, or the like. A shield layer (see FIG. 3) may be provided beneath the electrodes to reduce noise or other interference. The shield may extend beyond the grid of electrodes. Other configurations are also possible.

In some cases, no fixed reference point is used for measurements. The touch controller 208 may generate signals that are sent directly to the first or second sets 204, 206 of electrodes in various patterns.

In some cases, the component does not depend upon an absolute capacitive measurement to determine the location of a finger (or stylus, pointer, or other object) on a surface of the capacitance module 200. The capacitance module 200 may measure an imbalance in electrical charge to the electrode functioning as a sense electrode which can, in some examples, be any of the electrodes designated in either set 204, 206 or, in other examples, with dedicated-sense electrodes. When no pointing object is on or near the capacitance module 200, the capacitance controller 208 may be in a balanced state, and there is no signal on the sense electrode. When a finger or other pointing object creates imbalance because of capacitive coupling, a change in capacitance may occur at the intersections between the sets of electrodes 204, 206 that make up the touch/proximity sensitive area. In some cases, the change in capacitance is measured. However, in alternative example, the absolute capacitance value may be measured.

While this example has been described with the capacitance module 200 having the flexibility of the switching the sets 204, 206 of electrodes between sense and transmit electrodes, in other examples, each set of electrodes is dedicated to either a transmit function or a sense function.

Figure 3:
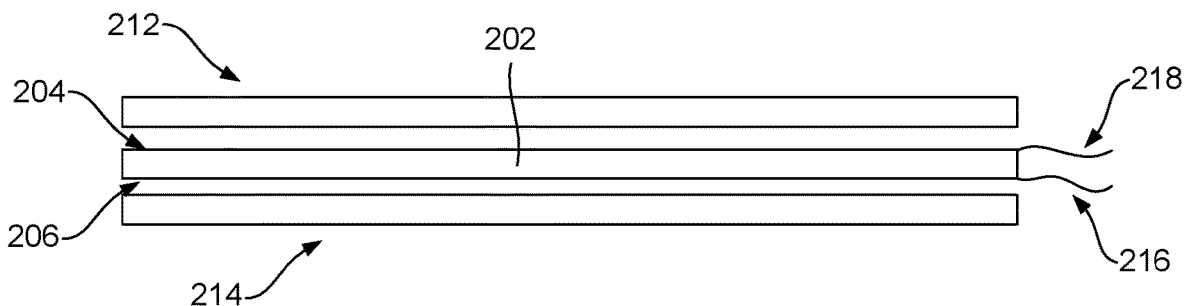
FIG. 3 depicts an example of a touch pad in accordance with the disclosure.

FIG. 3 depicts an example of a substrate 202 with a first set 204 of electrodes and a second set 206 of electrodes deposited on the substrate 202 that is incorporated into a capacitance module. The first set 204 of electrodes and the second set 206 of electrodes may be spaced apart from each other and electrically isolated from each other. In the example depicted in FIG. 3, the first set 204 of electrodes is deposited on a first side of the substrate 202, and the second set 206 of electrodes is deposited on the second side of the substrate 202, where the second side is opposite the first side and spaced apart by the thickness of the substrate 202. The substrate may be made of an electrically insulating material thereby preventing the first and second sets 204, 206 of electrodes from shorting to each other. As depicted in FIG. 2, the first set 204 of electrodes and the second set 206 of electrodes may be oriented transversely to one another. Capacitance measurements may be taken where the intersections with the electrodes from the first set 204 and the second set 206 overlap. In some examples, a voltage may be applied to the transmit electrodes and the voltage of a sense electrode that overlaps with the transmit electrode may be measured. The voltage from the sense electrode may be used to determine the capacitance at the intersection where the sense electrode overlaps with the transmit electrode.

In the example of FIG. 3 depicting a cross section of a capacitance module, the substrate 202 may be located between a capacitance reference surface 212 and a shield 214. The capacitance reference surface 212 may be a covering that is placed over the first side of the substrate 202 and that is at least partially transparent to electric fields. As a user's finger or stylus approach the capacitance reference surface 212, the presence of the finger or the stylus may affect the electric fields on the substrate 202. With the presence of the finger or the stylus, the voltage measured from the sense electrode may be different than when the finger or the stylus are not present. As a result, the change in capacitance may be measured.

The shield 214 may be an electrically conductive layer that shields electric noise from the internal components of the electronic device. This shield may prevent influence on the electric fields on the substrate 202. In some cases, the shield is solid piece of material that is electrically conductive. In other cases, the shield has a substrate and an electrically conductive material disposed on at least one substrate. In yet other examples, the shield is layer in the touch pad that performs a function and also shields the electrodes from electrically interfering noise. For example, in some examples, a pixel layer in display applications may form images that are visible through the capacitance reference surface, but also shields the electrodes from the electrical noise.

The voltage applied to the transmit electrodes may be carried through an electrical connection 216 from the touch controller 208 to the appropriate set of electrodes. The voltage applied to the sense electrode through the electric fields generated from the transmit electrode may be detected through the electrical connection 218 from the sense electrodes to the touch controller 208.

While the example of FIG. 3 has been depicted as having both sets of electrodes deposited on a substrate, one set of electrodes deposited on a first side and a second set of electrodes deposited on a second side; in other examples, each set of electrodes may be deposited on its own dedicated substrate.

Further, while the examples above describe a touch pad with a first set of electrodes and a second set of electrodes; in some examples, the capacitance module has a single set of electrodes. In such an example, the electrodes of the sensor layer may function as both the transmit and the receive electrodes. In some cases, a voltage may be applied to an electrode for a duration of time, which changes the capacitance surrounding the electrode. At the conclusion of the duration of time, the application of the voltage is discontinued. Then a voltage may be measured from the same electrode to determine the capacitance. If there is no object (e.g., finger, stylus, etc.) on or in the proximity of the capacitance reference surface, then the measured voltage off of the electrode after the voltage is discontinued may be at a value that is consistent with a baseline capacitance. However, if an object is touching or in proximity to the capacitance reference surface, then the measured voltage may indicate a change in capacitance from the baseline capacitance.

In some examples, the capacitance module has a first set of electrodes and a second set of electrodes and is communication with a controller that is set up to run both mutual capacitance measurements (e.g., using both the first set and the second set of electrodes to take a capacitance measurement) or self-capacitance measurements (e.g., using just one set of electrodes to take a capacitance measurement).

Figure 4:
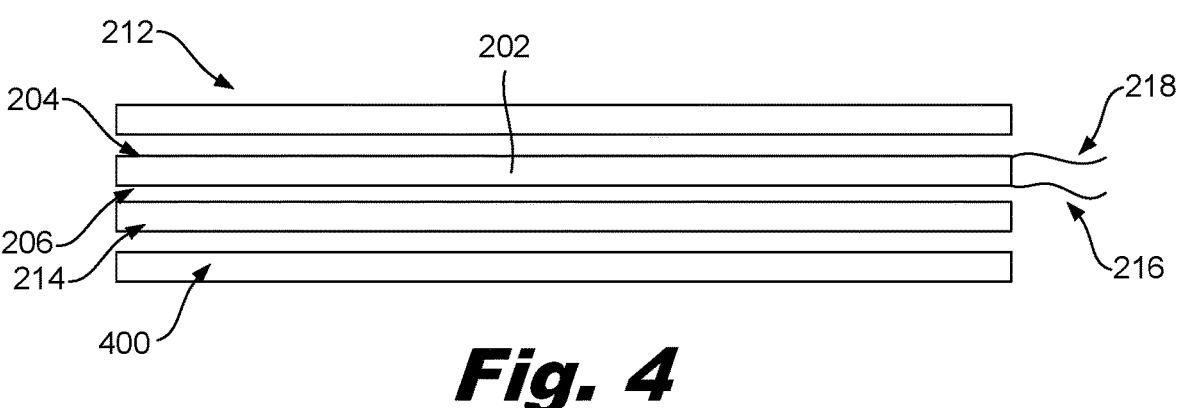
FIG. 4 depicts an example of a touch screen in accordance with the disclosure.

FIG. 4 depicts an example of a capacitance module incorporated into a touch screen. In this example, the substrate 202, sets of electrodes 204, 206, and electrical connections 216, 218 may be similar to the arrangement described in conjunction with FIG. 3. In the example of FIG. 4, the shield 214 is located between the substrate 202 and a display layer 400. The display layer 400 may be a layer of pixels or diodes that illuminate to generate an image. The display layer may be a liquid crystal display, a light emitting diode display, an organic light emitting diode display, an electroluminescent display, a quantum dot light emitting diode display, an incandescent filaments display, a vacuum florescent display, a cathode gas display, another type of display, or combinations thereof. In this example, the shield 214, the substrate 202, and the capacitance reference surface 212 may all be at least partially optically transparent to allow the image depicted in the display layer to be visible to the user through the capacitance reference surface 212. Such a touch screen may be included in a monitor, a display assembly, a laptop, a mobile phone, a mobile device, an electronic tablet, a dashboard, a display panel, an infotainment device, another type of electronic device, or combinations thereof.

Figure 5:
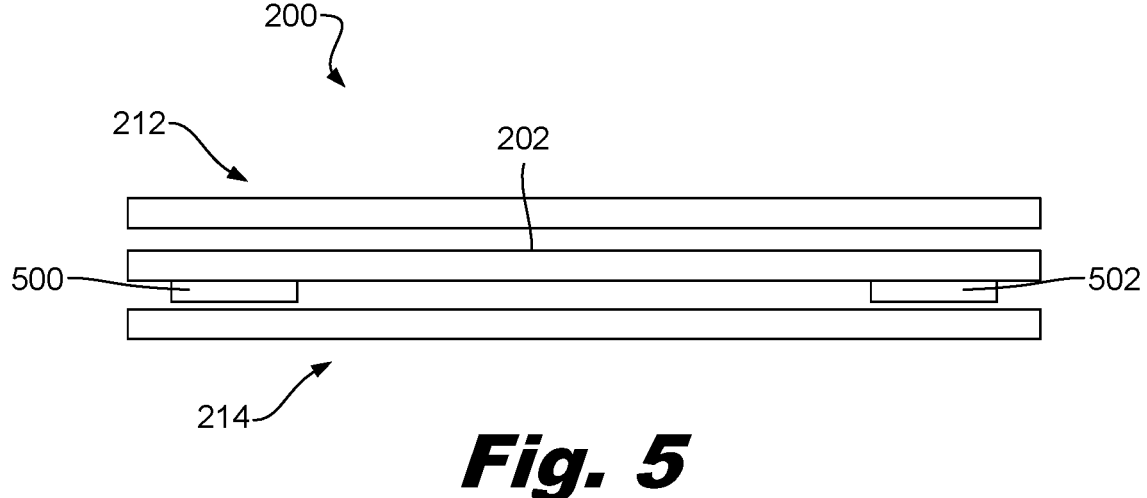
FIG. 5 depicts an example of a capacitance module in accordance with the disclosure.

FIG. 5 depicts an example of a cross section of a capacitance module 200 where the substrate 202 may be located between a capacitance reference surface 212 and a shield 214. In this example, a first haptic actuator 500 and a second haptic actuator r 502 are incorporated into the capacitance module pad 200. As depicted in this example, the haptic actuators 500, 502 may be disposed adjacent to an underside of the substrate 202. But, in other examples, the haptic actuators may be positioned at any appropriate location, including, but not limited to, adjacent the underside of the capacitance reference surface 212, adjacent the underside of the shield, another location, or combinations thereof. In examples where the haptic actuator 500, 502 are also pressure sensors and are positioned under the substrate 202, pressure applied to the capacitance reference surface 212 may be transmitted through the capacitance reference surface 212 exerting a pressure on the substrate 202, which in turn applies a pressure to at least one of the haptic actuators 500, 502. In examples where the haptic actuators are positioned adjacent to the shield, the pressure applied to input surface may be transmitted to the shield, which in turn applies the pressure to the haptic actuators. This pressure may be measured by the haptic actuators 500, 502 to determine the value of the pressure. In this example, the haptic actuator 500 is spaced apart from the second haptic actuator 502 at a distance along a length, width, and/or another dimension of the capacitance reference surface 212, which may allow the first haptic actuator 500 and the second haptic actuator 502 to detect different levels of pressure depending on the location where the pressure input is made on the capacitance reference surface 212. In some cases, those haptic actuators that are closer to the location where the pressure input is made can detect a greater pressure force than the pressure sensor that is located farther away. The differing pressure values may help determine where the pressure input is made.

While this example is depicted with a haptic actuator incorporated into a capacitance module with a capacitance sensor, in other examples, the haptic actuators are not incorporated with a capacitance sensor. Further, any appropriate type of haptic actuator may be used in accordance with the principles described herein.

A piezoelectric device may be used as both a pressure sensor and as a haptic device. When the piezoelectric material is compressed due to the application of pressure through the capacitance reference surface, the piezoelectric material may produce an electric signal with can be detected by a controller. In some cases, the controller may produce an electric signal that is sent to the piezoelectric material to cause the piezoelectric material to expand, contract, and/or vibrate. The vibrations from the piezoelectric material may cause the capacitance reference surface to vibrate. This vibration may communicate a haptic signal to the user. However, in some examples, the pressure sensors are not configured to provide a haptic signal.

Figure 6:
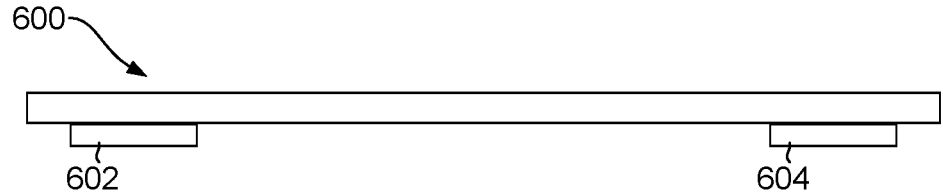
FIG. 6 depicts an example of a capacitance module in accordance with the disclosure.

FIG. 6 depicts an example of a reference surface 600. In this example, a first haptic actuator 602 and a second haptic actuator 604 are located adjacent to the reference surface 600. In this example, the first haptic actuator 602 and the second haptic actuator 604 are not incorporated into a stack having a capacitance sensor.

Figures 7, 8, 9, 10:
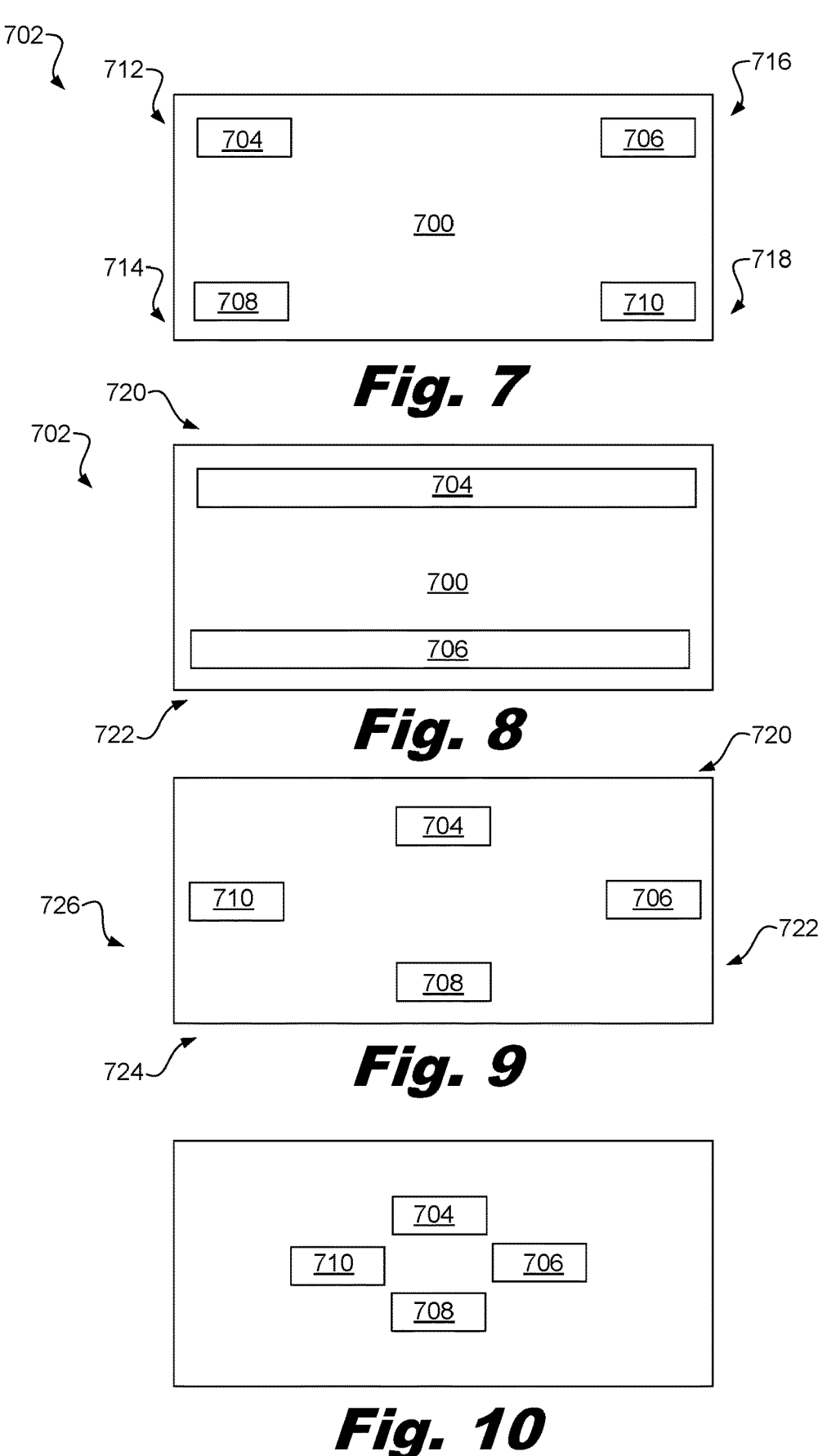
FIG. 7 depicts an example of an arrangement of haptic actuators in accordance with the disclosure.
FIG. 8 depicts an example of an arrangement of haptic actuators in accordance with the disclosure.
FIG. 9 depicts an example of an arrangement of haptic actuators in accordance with the disclosure.
FIG. 10 depicts an example of an arrangement of haptic actuators in accordance with the disclosure.

FIGS. 7-10 depict examples of haptic actuators depicted on an underside 700 of a reference surface 702. In the example of FIG. 7, the reference surface 702 has a rectangular shape and haptic actuators 704, 706, 708, 710 are positioned in each of the corners 712, 714, 716, 718. In the example of FIG. 8, just a first haptic actuator 704 is depicted on a first side 720, and a second haptic actuator 706 is depicted on a second side 722 of the input surface 702. In the example of FIG. 9, the haptic actuators 704, 706, 708, 710 are depicted in the center of the first side 720, the second side 722, the third side 724, and the fourth side 726. In the examples of FIG. 10, the haptic actuators 704, 706, 708, 710 are depicted towards the center of the input surface and away from the edges and corners of the input surface 702.

While the examples in FIGS. 7-10 are described with reference to a specific number of haptic actuators, any appropriate number of haptic actuators may be disposed adjacent to the input surface. For example, the number of haptic actuators may include one haptic actuator or multiple haptic actuators. While the examples depicted above are described with reference to specific patterns and locations for the haptic actuators, other arrangements are contemplated including, but not limited to, symmetric distribution of sensors, an asymmetric distribution of sensors, other distributions and patterns of sensors, or combinations thereof.

Figure 11A:
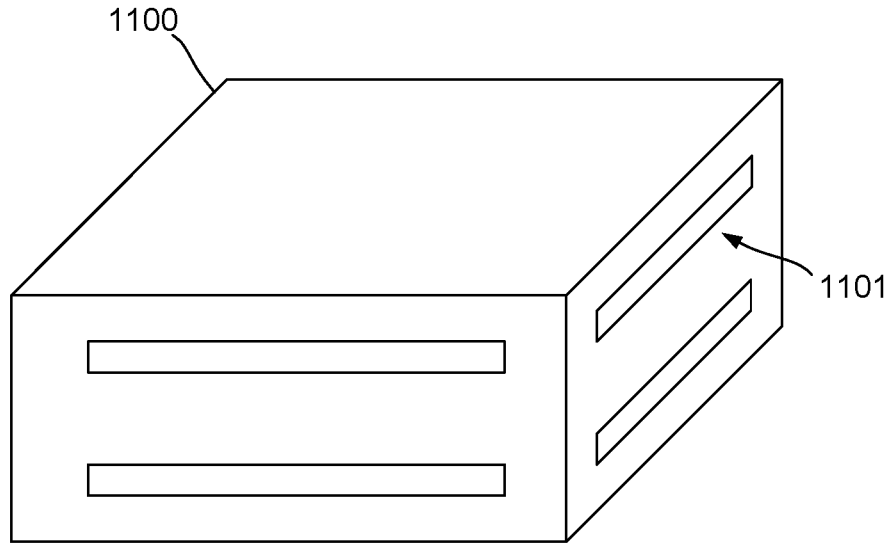
FIG. 11*a* depicts an example of a haptic housing in accordance with the disclosure.

FIG. 11a depicts a haptic housing 1100 in accordance with the disclosure. The haptic housing 1100 may be constructed of a material such as copper, aluminum, polycarbonate, plastic, printed circuit board, another material, or combinations thereof. The haptic housing 1100 may be a rigid structure. The rigidity of a haptic housing may have an effect on a vibration that passes through the housing. For example, a vibration that passes through a rigid haptic housing that is constrained from moving may weaken at least some of the haptic actuator's amplitude, whereas a vibration that passes through a flexible haptic housing may not decrease the haptic actuator's amplitude as much or at all.

Figure 11B:
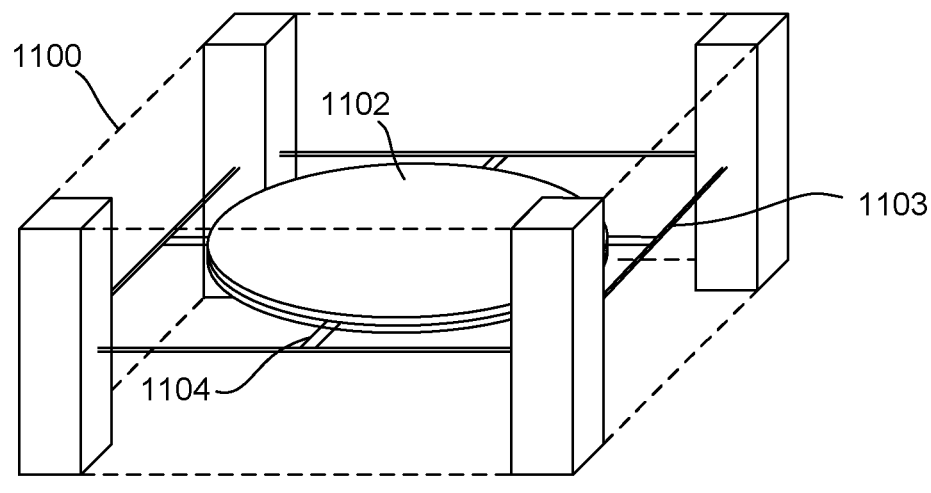
FIG. 11*b* depicts an example of a haptic housing interior in accordance with the disclosure.

For illustrative purposes, FIG. 11b depicts the interior of the haptic housing 1100 depicted in FIG. 11a. A haptic actuator 1102 may be located within the interior of the haptic housing 1100. The haptic actuator 1102 may be a piezoelectric actuator or another type of haptic actuator.

The interior of the haptic housing 1100 may include actuator supports 1103 that maintain the position of the haptic actuator 1102 within the haptic housing 1100. The haptic actuator 1102 may be connected to a haptic controller through electrical leads 1104 which may activate the actuator and detect input from the actuator.

In this example, the haptic housing 1100 includes four dissipation openings 1101. The dissipation openings 1101 may connect the interior of the haptic housing 1100 to the exterior of the housing. The dissipation openings 1101 may be defined as discontinuities through the material of the housing. In this example, the discontinuities that define the dissipation openings 1101 are rectangular holes on two sides of the haptic housing 1100. In other examples, dissipation openings may be defined as grooves in the material of a haptic housing. The dissipation openings may be through openings formed in the cross-sectional thickness of the housing wall. The dissipation opening may connect an inside surface of the haptic housing to an outside surface of the haptic housing.

While in this example the haptic housing 1100 includes four dissipation openings 1101 with rectangular shapes, in other examples, a haptic housing may include a different number of dissipation openings with different shapes. For example, a haptic housing may include one circular dissipation opening, one circular dissipation opening with a rectangular dissipation opening, two dissipation openings with square shapes and a third dissipation opening with a circle shape, etc.

Figure 12A:
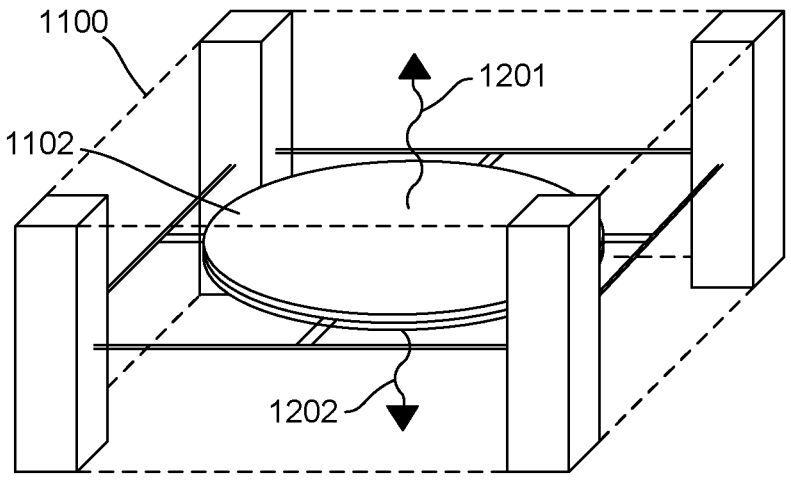
FIG. 12*a* depicts an example of a haptic vibration in accordance with the disclosure.

FIG. 12a depicts an example of a haptic vibration in accordance with the disclosure. An electrical current may be applied to the haptic actuator 1102 by the electrical leads 1202. When an electrical current is applied to the haptic actuator 1102, the actuator may expand in a first expansion 1201. After the first expansion 1201, the haptic actuator may contract and expand in a second expansion 1202. The first expansion 1201, contraction, and second expansion 1202 may occur very rapidly, within a period of just a few microseconds. The haptic actuator 1102 may generate a haptic vibration through repeated expansions and contractions.

The displacement of the haptic actuator 1102 during the first expansion 1201 or second expansion 1202 may have a positive effect on the amplitude of the haptic vibration. The greater the displacement by the haptic actuator 1102, the greater the amplitude of the haptic vibration.

Figure 12B:
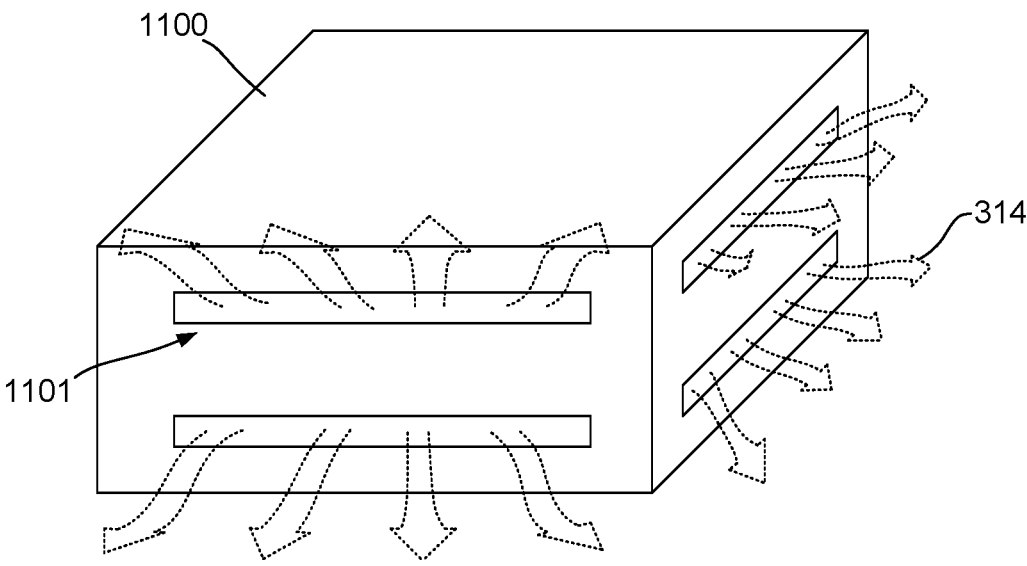
FIG. 12*b* depicts an example of air flow through dissipation openings in accordance with the disclosure.

FIG. 12b depicts an example of air flow through dissipation openings in accordance with the disclosure. During the process of generating a haptic vibration, ambient air within the interior of the haptic housing 1100 may be displaced by the movement of the haptic actuator 1102. The air pressure within the interior of the haptic housing 1100 may have an effect on the amplitude of the haptic vibration generated by the haptic actuator 1102. The greater the air pressure, the greater the resistance to the haptic actuator's displacement, which may negatively affect the haptic actuator's amplitude. The greater the resistance to the haptic actuator 1102, the lower the displacement, therefore decreasing the overall amplitude of the haptic vibration.

The dissipation openings 1101 in the haptic housing 1100 may have the effect of decreasing the air pressure within the haptic housing when the haptic actuator is moving. The decreased air pressure may increase the amplitude of the haptic vibration generated by the haptic actuator 1102 given the same energy input into the haptic actuator. During the first expansion 1201 or second expansion 1202, air displaced by the piezo actuator 1102 may flow through the dissipation openings 1101, decreasing the ambient air pressure of the interior of the haptic housing 1100. By decreasing the ambient air pressure, the dissipation openings 1101 may negate the effects of air resistance during the first expansion 1201 or the second expansion 1202, thereby increasing the overall amplitude of the haptic vibration generated by the haptic actuator 1102.

Figure 13A:
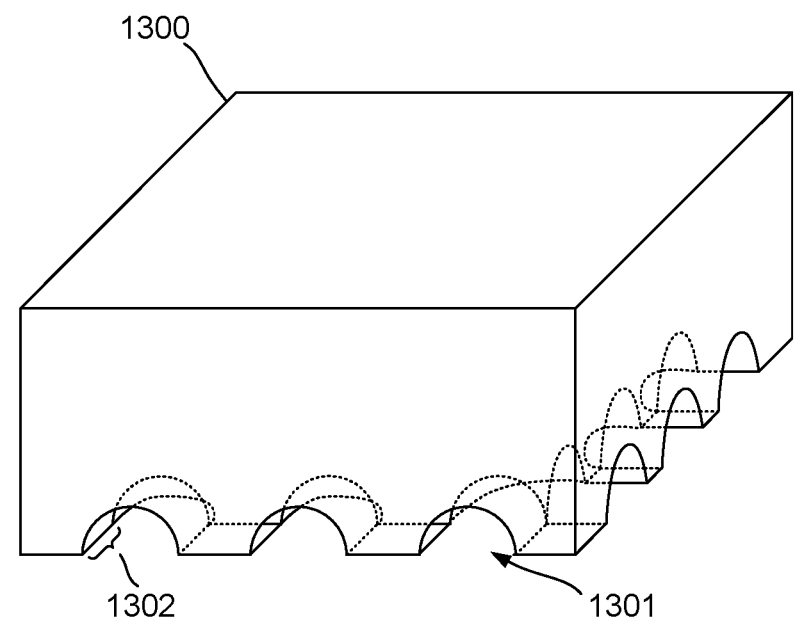
FIG. 13*a* depicts an example of a haptic housing in accordance with the disclosure.

While the haptic housing in FIGS. 11-13 includes dissipation openings 1101 as through holes defined through the side of the haptic housing 1100, in other examples, dissipation openings may be defined as grooves with an open side in the material of a haptic housing. FIG. 13a depicts an example of a haptic housing 1300 with dissipation openings 1301 as grooves in the material of the housing, in accordance with the disclosure.

In this example, the dissipation openings 1301 are grooves in the material of the haptic housing 1300. The dissipation openings 1301 include three grooves on one edge of the haptic housing 1300 and three grooves on another edge of the haptic housing. While the haptic housing 1300 depicted in FIG. 13a depicts dissipation openings as three grooves on two edges of the housing each, in other examples, dissipation openings may be defined with more or less grooves. Furthermore, while the dissipation openings 1302 have a circular shape, in other examples, a dissipation opening may be a groove with a different shape.

The dissipation openings 1302 may extend through the width 1302 of the material of the haptic housing 1300. The dissipation openings 1300 may connect the interior of the haptic housing 1300 to the exterior of the housing. Connecting the interior of the haptic housing 1300 to the exterior of the housing may ensure air flow from the interior of the housing to the exterior during the process of generating a haptic vibration.

In some cases, the dissipation openings 1302 may be defined by removing material from the haptic housing 1300. For example, the grooves that define the dissipation openings 1302 may be carved, etched, or otherwise defined in the material of the haptic housing 1300. In other examples, the haptic housing 1300 may be molded such that the dissipation openings 1302 are defined in the housing.

Figure 13B:
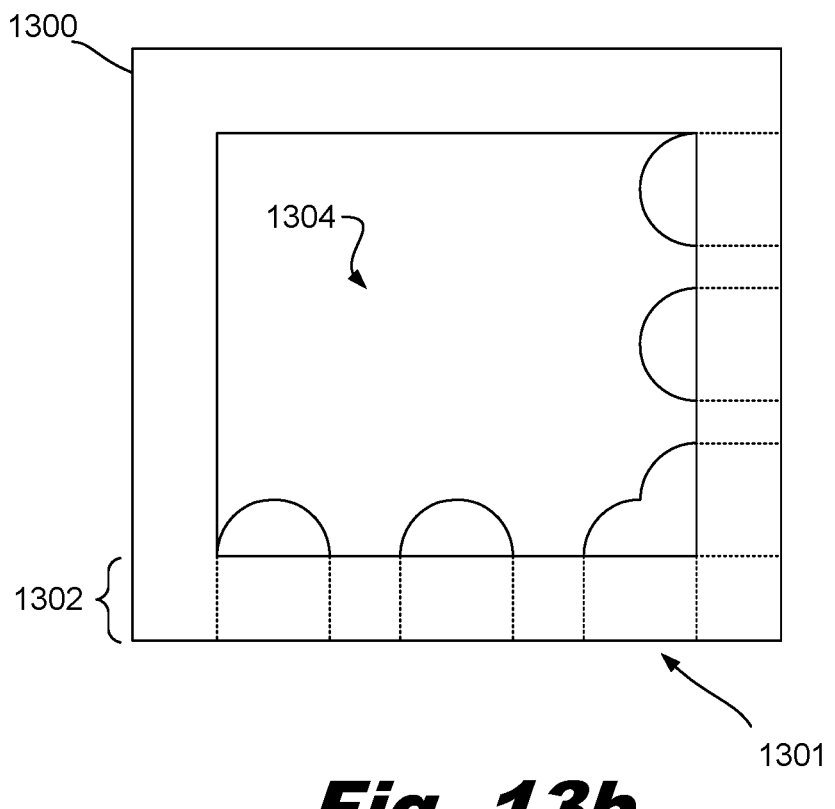
FIG. 13*b* depicts an example of a haptic housing in accordance with the disclosure.

FIG. 13b depicts the haptic housing 1300 in accordance with the disclosure. For illustrative purposes, the haptic housing 1300 is depicted with a cross sectional view from the top down. The dissipation openings 1301 may extend through the width 1302 of the material of the haptic housing 1300. The dissipation openings may also extend through parts of another face of the haptic housing 1300. A bottom face 1304 of the haptic housing 1300 is depicted. The dissipation openings 1301 are defined through portions of the bottom edge 1304.

Figure 14A:
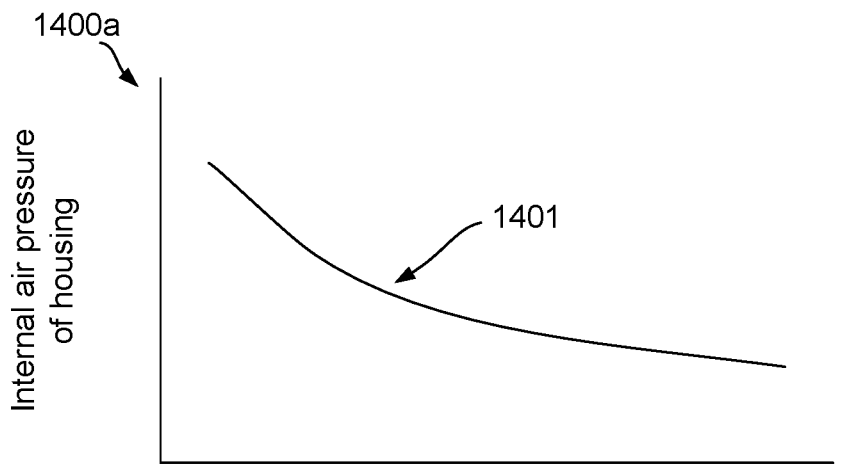
FIG. 14*a* depicts an example of air pressure in accordance with the disclosure.

FIG. 14a depicts an example of an air pressure graph 1400a in accordance with the disclosure. The graph 1400a depicts the internal air pressure of a haptic housing versus the dissipation opening volume of the haptic housing. The relationship between the internal air pressure and the dissipation opening volume is depicted with the curve 1401. The internal air pressure may decrease as the volume of the dissipation opening increases. In other words, the larger the dissipation openings in a haptic housing, the smaller the internal air pressure of the housing.

Figure 14B:
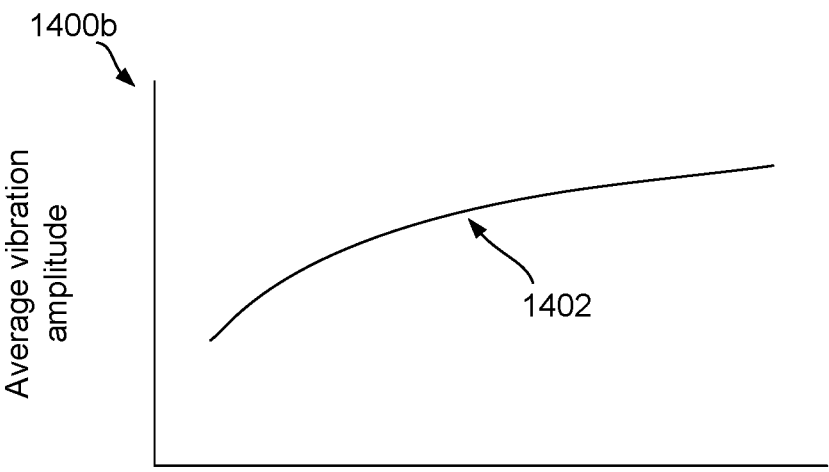
FIG. 14*b* depicts an example of a vibration amplitude in accordance with the disclosure.

FIG. 14b depicts an example of a vibration amplitude graph 1400b in accordance with the disclosure. In this example, the graph 1400b depicts an average vibration amplitude of a haptic vibration generated by a haptic actuator versus the dissipation opening volume of the haptic housing that the haptic actuator is within. The relationship between the average vibration amplitude and the dissipation opening volume may be depicted with the curve 1402. The average vibration amplitude may increase as the volume of the dissipation opening increases. In other words, in some cases, the larger the dissipation openings in a haptic housing, the greater the amplitude of a haptic vibration generated by a haptic actuator within the haptic housing.

In some cases, the relationship between dissipation opening volume and internal air pressure and vibration amplitude may not be linear. As a dissipation opening volume increases, the reduction of air pressure may level out. Likewise, in some cases, as dissipation opening volume increases, the increase in average amplitude may level out.

Figure 15A:
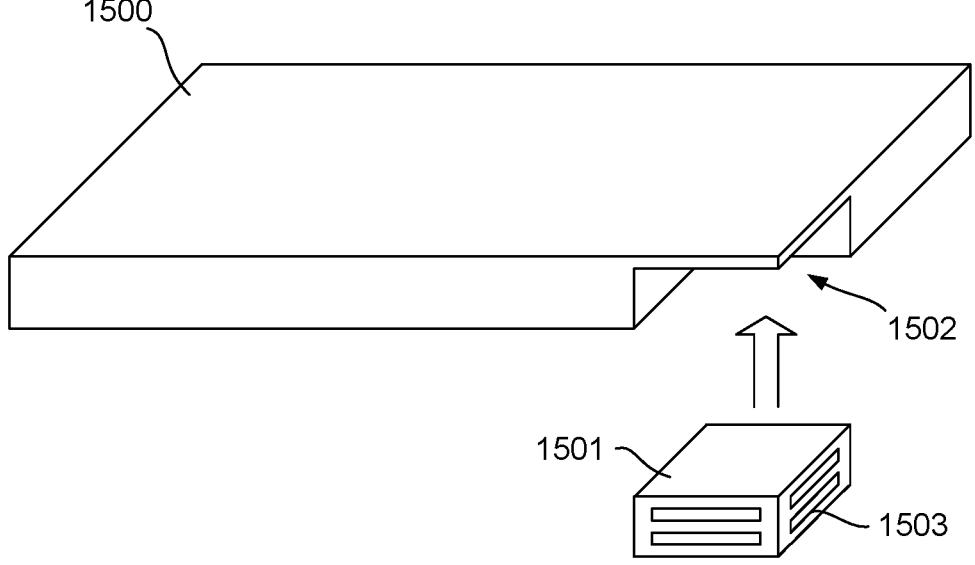
FIG. 15*a* depicts an example of a substrate in accordance with the disclosure.
Figure 15B:
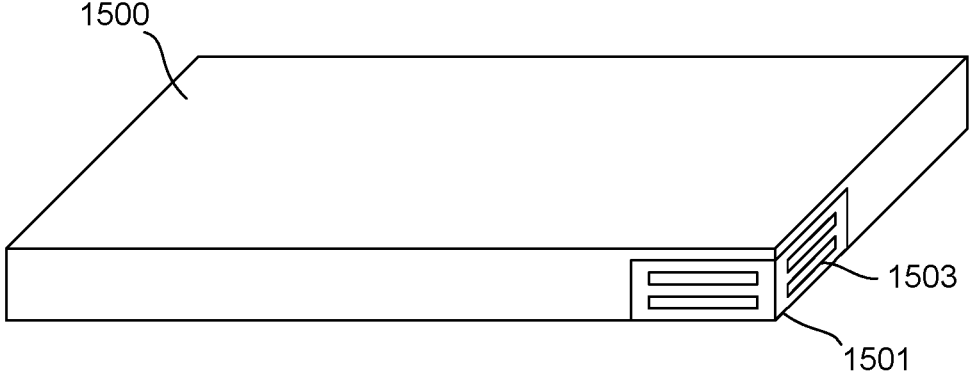
FIG. 15*b* depicts an example of a substrate in accordance with the disclosure.

FIG. 15a depicts an example of a substrate 1500 in accordance with the disclosure. In this example, the substrate 1500 includes a cavity 1502 defined in the material of the substrate. A haptic housing 1501 may be adhered to the substrate 1500, being disposed within the cavity 1502. FIG. 15b depicts the substrate 1500 with the haptic housing 1501 attached within the cavity.

While the substrate 1500 depicted in this example includes only a single cavity 1502 and a single haptic housing 1501, in other examples, a substrate may include a different number of cavities and a different number of haptic actuators. For example, a substrate may include four cavities and four haptic actuators, three cavities and three haptic actuators, five cavities and four haptic actuators, a different number of cavities and haptic actuators, or combinations thereof.

By embedding a haptic housing within a substrate, the overall size of a device that includes haptic actuators may be reduced. By embedding haptic housings within a substrate of the touchpad, the size of the touchpad in a laptop may be reduced.

While embedding a haptic housing within a substrate may reduce the overall footprint of a device that includes a haptic actuator, the stiffness of the material of the substrate may absorb the vibration from the haptic actuator, reducing the overall amplitude of the haptic vibration. Dissipation holes 1503 in the haptic housing 1501 may alleviate this issue. By reducing air pressure within the haptic housing 1501, the dissipation holes 1503 may increase the amplitude of a vibration generated by the haptic actuator within the housing. The haptic actuator in the haptic housing 1501 may generate a stronger haptic vibration using the same electrical current input or less as a haptic actuator in a housing without dissipation holes embedded in the substrate 1500.

Figure 16A:
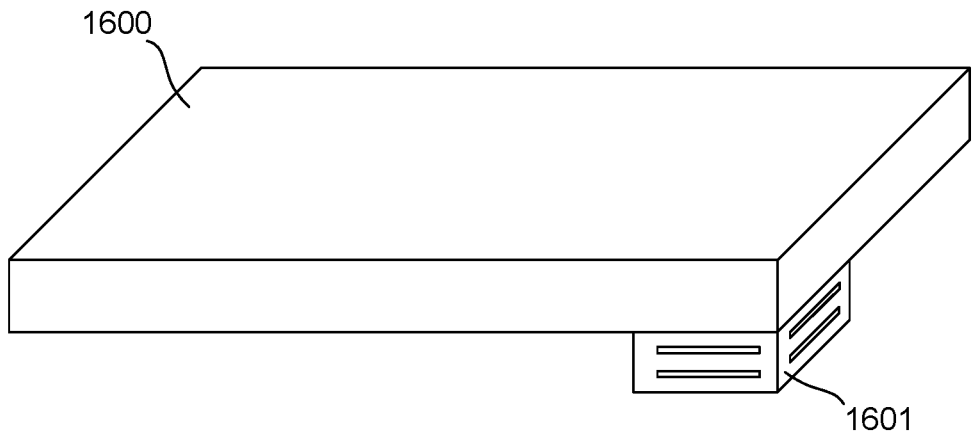
FIG. 16*a* depicts an example of a substrate in accordance with the disclosure.

FIG. 16a depicts an example of a substrate 1600 in accordance with the disclosure. In this example, a haptic housing 1601 is rigidly attached to the substrate 1600. As illustrated in FIGS. 15a and 15b, a haptic housing may be embedded within a cavity of a substrate. In this example, the haptic housing 1601 is attached to one side of the substrate 1600. In some examples, the haptic housing 1601 may be rigidly adhered to part of the substrate 1600 using an adhesive. In other examples, the haptic housing 1601 may be attached to part of the substrate 1600 during a stage of the manufacturing process. In yet other examples, the haptic housing 1600 may be constructed as part of the substrate 1600 during the manufacturing process, and a haptic actuator may be inserted into the housing at a later stage of the manufacturing process.

In some cases, by rigidly attaching the haptic housing 1601 to the substrate 1600, a haptic vibration generated by a haptic actuator in the haptic housing may be transmitted through the material of the substrate 1600 without a significant loss of amplitude. In some cases, it may be beneficial to rigidly adhere a haptic housing to a substrate instead of positioning a haptic housing adjacent to a substrate.

Figure 16B:
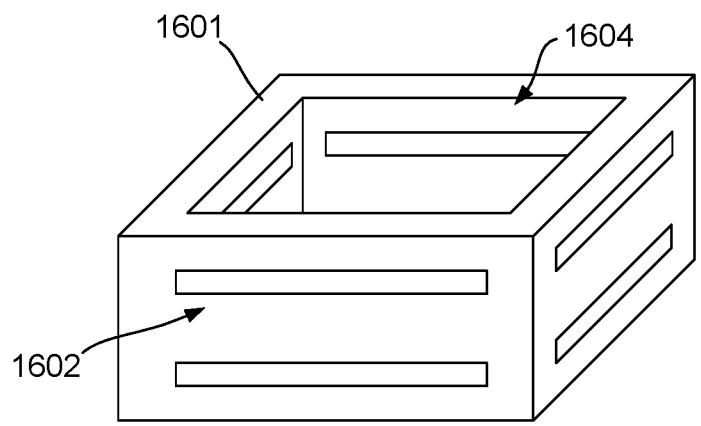
FIG. 16*b* depicts an example of a haptic housing in accordance with the disclosure.

FIG. 16b depicts an example of a haptic housing 1601 in accordance with the disclosure. In this example, the haptic housing 1601 includes an opening 1604 on one of its sides. The haptic housing 1601 may be attached to the substrate 1601 on the side with the opening 1604.

The haptic housing 1601 includes dissipation openings 1602 in four of its faces. A haptic housing attached to a substrate instead of embedded in a cavity of a substrate may include more dissipation openings. In comparison to the haptic housing 1501 depicted in FIGS. 15a and 15b, which only included dissipation openings 1503 on two of its faces, the haptic housing 1601 includes dissipation openings 1602 on four of its faces. Whether a face of a haptic housing includes dissipation openings may correspond to whether the face of a haptic housing is exposed to air in a device.

Figure 16C:
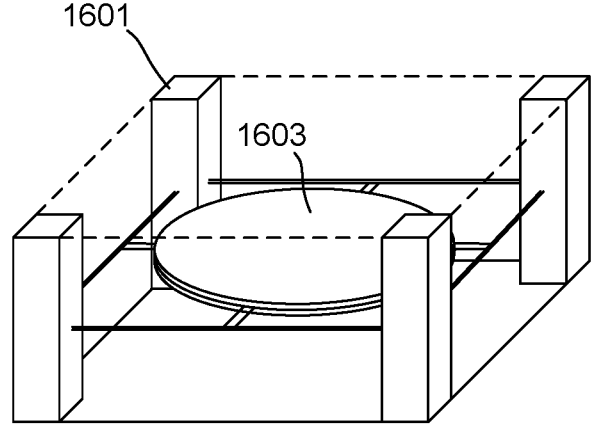
FIG. 16*c* depicts an example of an interior of a haptic housing in accordance with the disclosure.

FIG. 16c depicts an example of a haptic housing interior in accordance with the disclosure. In this example, the interior of the haptic housing 1601 includes a haptic actuator 1603. The haptic actuator 1603 may be placed within the haptic housing 1601 during a step in the manufacturing process of the haptic housing or inserted into the haptic housing after it has been manufactured. The haptic actuator may be a piezoelectric haptic actuator, a linear actuator, a linear resonant actuator, a rotatable mass actuator, a magnetostrictive actuator, a different kind of haptic actuator, or a combination thereof.

Figure 17A:
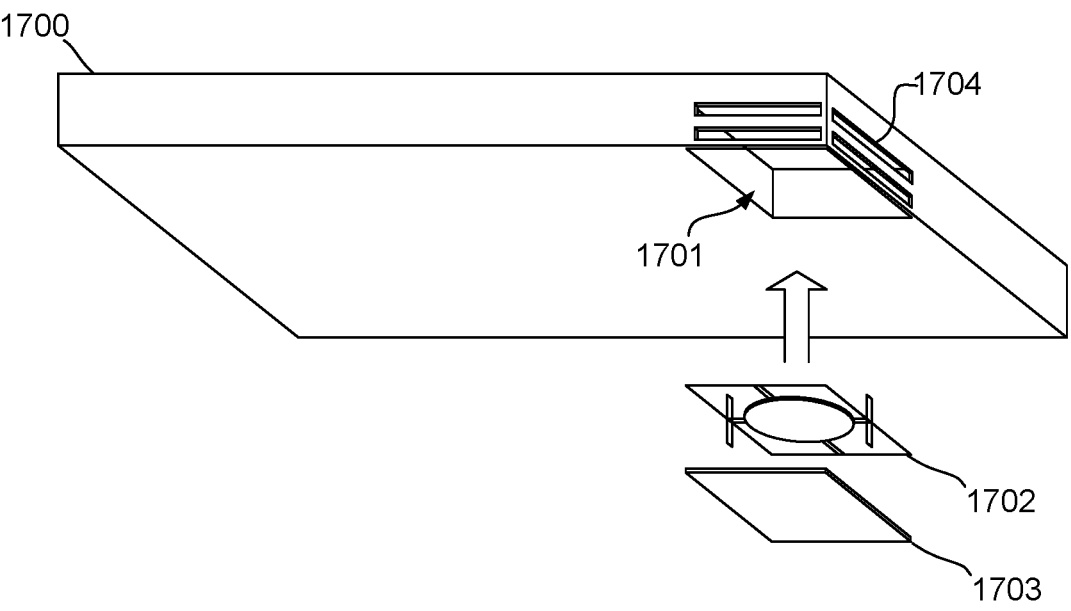
FIG. 17*a* depicts an example of a substrate in accordance with the disclosure.

FIG. 17a depicts an example of a substrate 1700 with an embedded haptic actuator 1702 in accordance with the disclosure. In this example, the substrate 1700 includes a cavity 1701 defined in the material of the substrate where the cavity is the haptic housing. The substrate 1700 may include dissipation openings 1704 defined in the material of the substrate that connect the cavity 1701 to the outside of the substrate 1700. The haptic actuator 1702 may be placed within the cavity 1701. A cover 1703 may be placed over the opening of the cavity 1701. The cover 1703 may hold the haptic actuator 1702 within the cavity 1701 of the substrate.

Figure 17B:
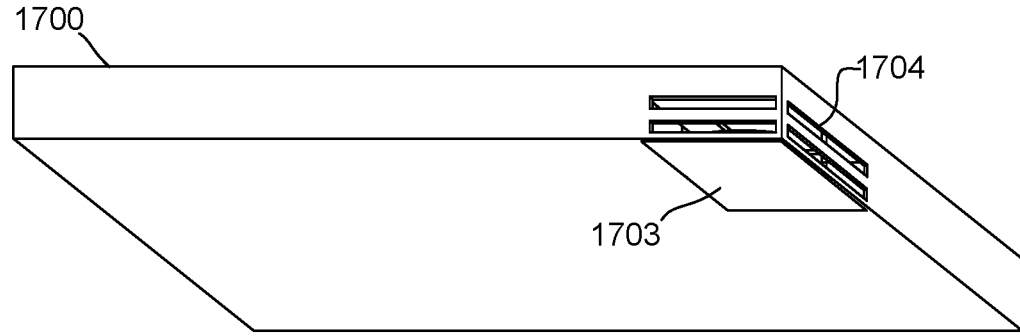
FIG. 17*b* depicts an example of a substrate in accordance with the disclosure.

FIG. 17B depicts the substrate 1700 with the haptic actuator 1702 embedded within the cavity 1701 and the cover 1703 placed over the cavity. By embedding the haptic actuator 1702 within a cavity of the substrate 1700, the material that would have been used to create a haptic housing for the haptic actuator 1702 may be saved, reducing material cost.

The haptic actuator 1702 may generate a haptic vibration by rapidly expanding and contracting. Air displaced by the expansion and contraction of the haptic actuator 1702 may flow through the dissipation openings 1704, preventing an air pressure increase within the cavity 1701 as the haptic actuator expands and contracts. By preventing the air pressure build up that may inhibit the expansion and contraction of the haptic actuator, the amplitude of a haptic vibration generated by the haptic actuator may be produced at the appropriate level without having to add additional electrical input to the haptic actuator. The haptic vibration may travel throughout the material of the substrate 1700.

Figure 18:
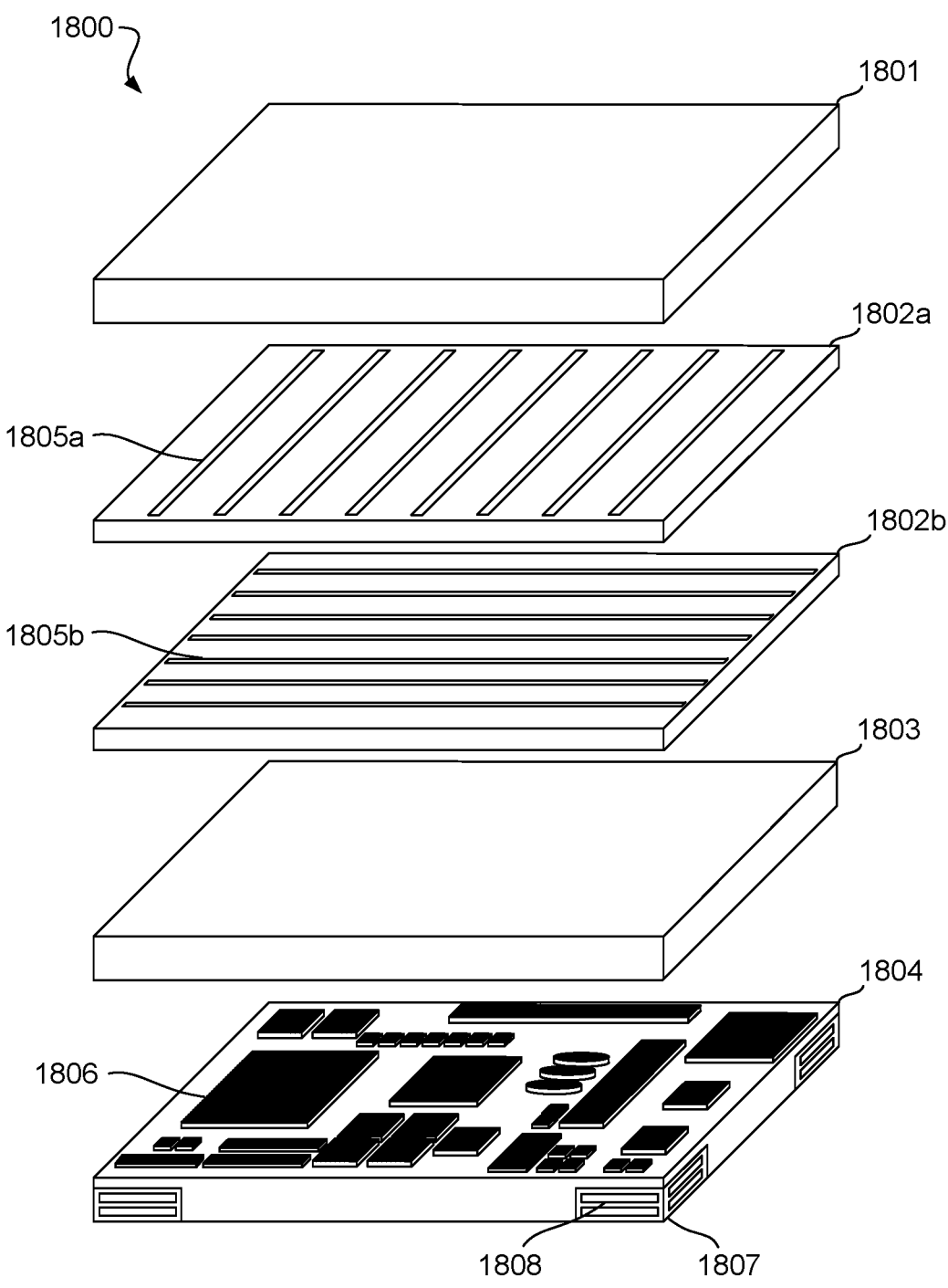
FIG. 18 depicts an example of a capacitance module in accordance with the disclosure.

FIGS. 15a-17b depict examples of substrates that included haptic actuators. Such substrates may be included in capacitance module devices. FIG. 18 depicts an example of a capacitance module 1800 in accordance with the disclosure. The capacitance module 1800 may include a capacitance reference surface 1801, a first electrode layer 1802a, a second electrode layer 1802b, a shield layer 1803, and a component layer 1804. The component layer 1804 may include four haptic housings 1807 embedded in the substrate of the component layer 1804.

In some examples, the capacitance reference surface 1801 is not part of the capacitance module 1801. In some examples, the capacitance module 1801 may include more or fewer layers than described in connection with FIG. 18.

The capacitance module 1800 may be included in devices that utilize touch sensing. For example, the capacitance module 1800 may be included in a computer device such as a laptop as a touchpad, a gaming controller, a touch screen, an infotainment system, a wearable, a touch surface, an input device, another type of device, or combinations thereof. In some cases, the capacitance device may be included in not touch devices, such as proximity detectors, stud finders, metal detectors, other types of devices, or combinations thereof. In other examples, the capacitance module may be included in devices that utilize proximity sensing or another type of sensing.

In some examples, such as examples where the capacitance module 1800 is a touchpad, a user may interact with the capacitance module 1800 by touching the capacitance reference surface 1801 with a finger, stylus, or other input method. The reference capacitance surface may be an overlay, a keyboard housing surface, another type of surface, or combinations thereof. The capacitance reference surface 1801 may be made of a material such as glass, plastic, another material, or combinations thereof.

The first electrode layer 1802a is located adjacent to the capacitance reference surface 1801. The first electrode layer 1802a includes a first set 1805a of electrodes. The electrodes in the first set 1805a may be transmit electrodes, sense electrodes, another type of electrodes, or combinations thereof. The electrodes in the first set 1805a of electrodes may be made of a conductive material such as copper, gold, another conductive material, or combinations thereof.

The second electrode layer 1802b is located adjacent to the first electrode layer 1802a. The second electrode layer 1802b includes a second set 1805b of electrodes. The electrodes in the second set 1805b may be transmit electrodes, sense electrodes, another type of electrodes, or combinations thereof. The electrodes in the second set 1805b may be made of a conductive material such as copper, gold, another conductive material, or combinations thereof.

The first set 1805a of electrodes may be transversely oriented from the second set 1805b of electrodes. Together the first set 1805a and second set 1805b of electrodes may form a mutual capacitance sensor. User input to the capacitance module 1800 may be detected by the mutual capacitance sensor formed by the first set 1805a and second set 1805b of electrodes.

In some examples, the capacitance sensor includes a single set of electrodes on a single layer and operates to detect changes in capacitance through a self-capacitance protocol. In other others, the capacitance sensor includes a first and a second set of electrodes on the same substrate. In other examples, the capacitance sensor may include multiple sets of electrodes and may be configured to detect changes in capacitance through a mutual capacitance protocol, a self-capacitance protocol, another type of protocol, or combinations thereof.

In the illustrated example, the shield layer 1803 is located adjacent to the second electrode layer 1802b. The shield layer 1803 may be constructed out of a material designed to block electronic interference that may interfere with the operation of sensitive electrical components of the capacitance module 1800, such as the first set 1805a or second set 1805b of electrodes. Electronic interference may originate from other parts of the capacitance module 1800, such as components 1806 on the component layer 1804, or it may originate from parts of a device in which the capacitance module 1800 is included such as a battery or an antenna. The shield layer 1803 may be made of copper, aluminum, an electrically conductive material, another appropriate shielding material, or combinations thereof.

In the illustrated example of FIG. 18, the component layer 1804 is located adjacent to the shield layer 1803. The component layer 1804 includes components 1806 that may be used in the operation of the capacitance module 1800. Components may include but are not limited to a central processing unit (CPU), a digital signal processor (DSP), an analog front end (AFE), an amplifier, a peripheral interface controller (PIC), another type of microprocessor, an integrated circuit, a field programmable gate array (FPGA), an application specific integrated circuit (ASIC), a combination of logic gate circuitry, a processing unit, memory, other types of digital or analog electrical components, or combinations thereof.

The component layer 1804 may include haptic housings 1807 embedded in the substrate of the component layer. The haptic housings 1807 may include dissipation openings 1808 constructed to increase the amplitude of haptic vibrations from haptic actuators within the haptic housings.

While in this example, the haptic housings 1807 are embedded in the substrate of the component layer 1804, in other examples, a haptic housing may be embedded in a different part of a capacitance module. The location of haptic housings within a capacitance module may correspond to the perception of a haptic vibration generated by an actuator within the housing. The closer a haptic housing is to a location of user interaction, in this case, the capacitance reference surface 1801, the more perceptible the vibration of a haptic actuator may be to a user.

While in this example, the haptic housings 1807 are embedded on a bottom side of the component layer 1804 relative to the capacitance reference surface 1801, in other examples, a haptic housing may be embedded on a different side of a layer. Furthermore, the location of the embedded haptic housings 1807 may depend on the location of components 1806 on the component layer 1804.

Figure 19:
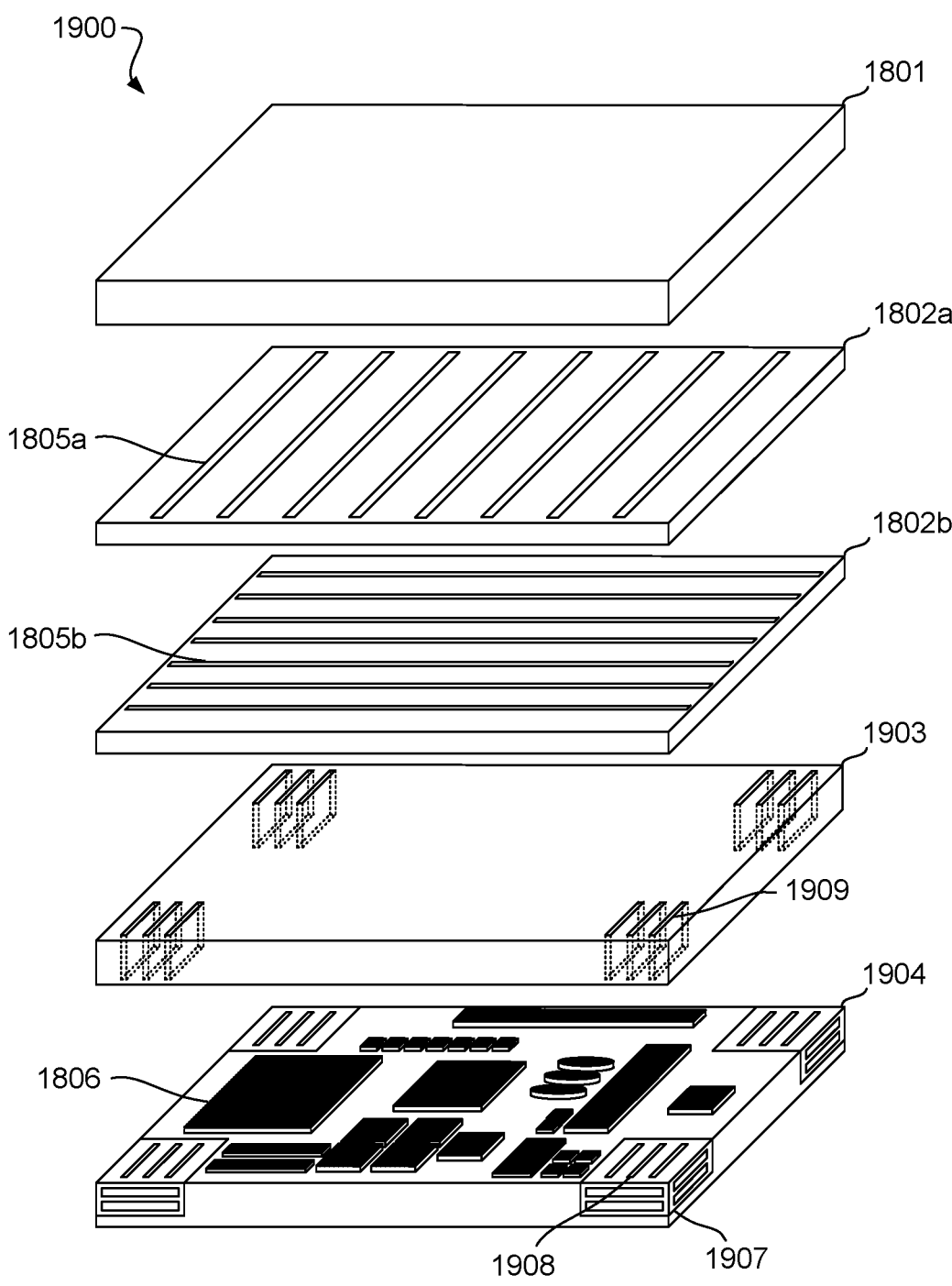
FIG. 19 depicts an example of a capacitance module in accordance with the disclosure.

FIG. 19 depicts an example of a capacitance module in accordance with the disclosure. In this example, a capacitance module 1900 includes the capacitance reference surface 1801, the first electrode layer 1802a, the second electrode layer 1802b, a shield layer 1903, and a component layer 1904. The component layer 1904 includes four haptic housings 1907 embedded on a top side of the component layer 1904 relative to the capacitance reference surface 1801.

In this example, the haptic housings 1907 include dissipation openings 1908 on three faces of the housing. Dissipation openings 1908 are defined in the inside faces of the haptic housings 1907. Dissipation openings 1909 are defined in the adjacent shield layer 1903. The dissipation openings 1909 in the shield layer 1903 may overlap with the dissipation openings 1908 in the haptic housings 1907. Air may flow through the dissipation openings 1907 and through the dissipation openings 1909 in the shield layer 1903.

Because of the dissipation openings 1909 defined in the shield layer 1903, the haptic housings 1907 are enabled to include more dissipation openings 1908. By including more dissipation openings 1908 in the haptic housing 1907, the haptic actuators within the haptic housings 1907 may be able to dissipate more air, increasing the amplitude of a haptic vibration.

The haptic housing may include dissipation opening on any appropriate set of sides. A non-exhaustive list of sides that may include dissipation openings includes, but is not limited to, the haptic housing including at least one dissipation opening on a single side, a two sides, on three sides, on four sides, on five sides, on six sides, on another appropriate number of sides, on contiguous sides, on opposing sides, transversely oriented sides, on multiple contagious sides, on aligned sides, on another set of sides, or combinations thereof.

Figure 20:
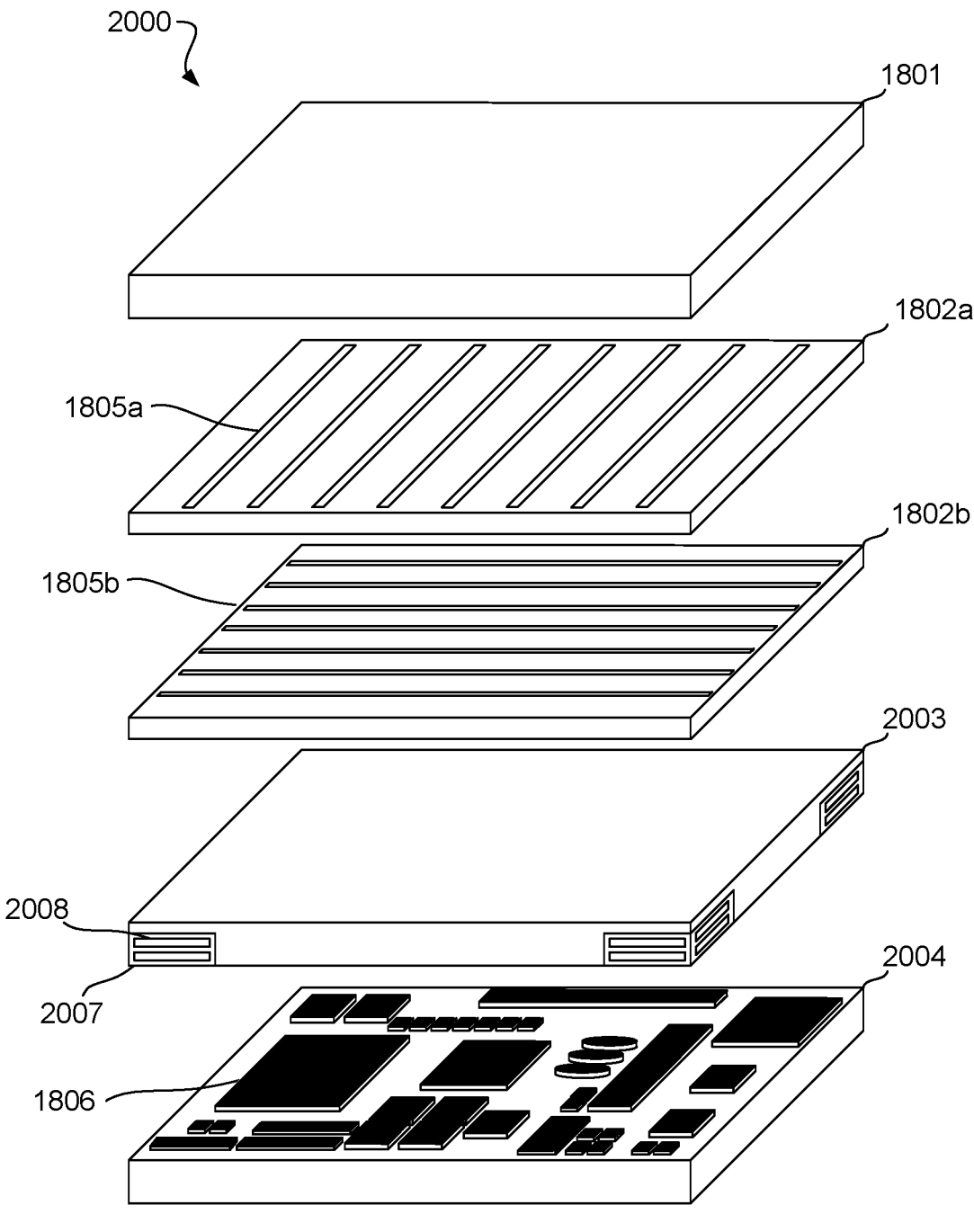
FIG. 20 depicts an example of a capacitance module in accordance with the disclosure.

FIG. 20 depicts an example of a capacitance module in accordance with the disclosure. In this example, a capacitance module 2000 includes the capacitance reference surface 1801, the first electrode layer 1802a, the second electrode layer 1802b, a shield layer 2003, and a component layer 2004. The shield layer 2003 includes four haptic housings 2007 embedded in the substrate of the shield layer. Each haptic housing 2007 includes dissipation openings 2008.

Embedding haptic housings 2007 within the shield layer 2003 of the capacitance module 2000 may increase the perception of a haptic vibration generated by haptic actuators within each haptic housing to a user. The increased perception of vibration may be because the haptic housings 2007 are located closer to the capacitance reference surface 1801 than haptic housings embedded in a component layer of a capacitance module (see FIGS. 18 and 19).

Embedding haptic housings 2007 within the shield layer 2003 of the capacitance module 2000 may also allow for more components 1806 to be included on the component layer 2004. The haptic housings 2007 occupy a relatively larger volume compared to components 1806 that may be included on the component layer 2004, so by embedding the haptic housings 2007 in the shield layer 2003 of the capacitance module 2000 instead of the component layer 2004, more components 1806 may be included on the component layer 2004 compared to component layers that include embedded haptic housings (see FIGS. 18 and 19).

A haptic housing may include dissipation openings of various shapes, sizes, and locations. The shape, size, and location of a dissipation opening in a haptic housing may depend on the vibrational strength of an actuator within a housing, the manufacturing process of a housing, other factors, or combinations thereof.

In some examples, stack of layers of the capacitance module may be formed with cavities exposed on the side of the shield layer. In this example, the haptic housings may be inserted into the openings after the capacitance module's stack of layers are formed. In other examples, the openings may be etched or otherwise formed during an additional process after the stack or layers has been assembled. In some examples, the cavities for the haptic actuators may be formed in the shield layer, the component layer, a capacitance sensor layer, another layer of the capacitance module, or combinations thereof.

Figure 21:
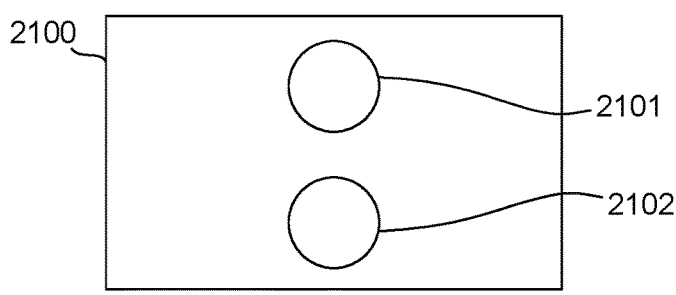
FIG. 21 depicts an example of dissipation openings in accordance with the disclosure.

FIG. 21 depicts an example of dissipation openings in accordance with the disclosure. In this example, a first dissipation opening 2101 and a second dissipation opening 2102 have circular shapes. The first dissipation opening 2101 is located above the second dissipation opening on the face 2100 of a haptic housing. Dissipation openings with circular shapes may be simpler to define in a haptic housing than dissipation openings with more complex shapes.

Figure 22:
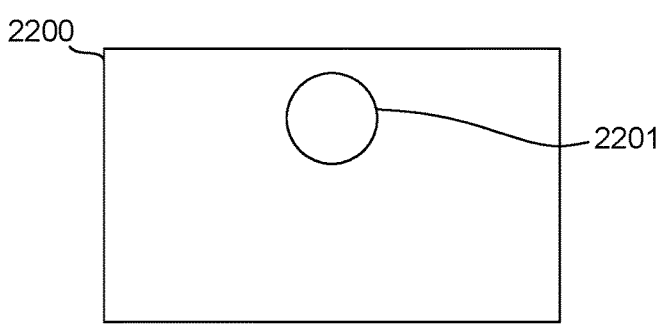
FIG. 22 depicts an example of a dissipation opening in accordance with the disclosure.

FIG. 22 depicts an example of a dissipation opening in accordance with the disclosure. In this example, a single dissipation opening 2201 is defined in a face 2200 of a haptic housing.

Figure 23:
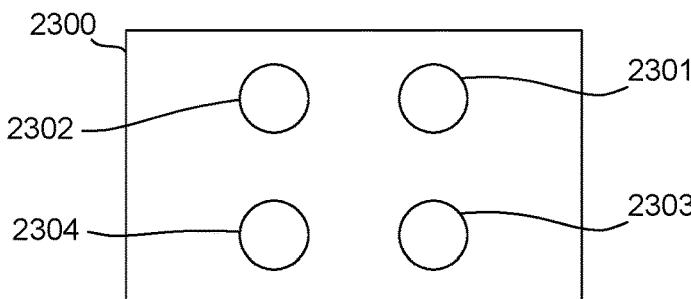
FIG. 23 depicts an example of dissipation openings in accordance with the disclosure.

FIG. 23 depicts an example of dissipation openings in accordance with the disclosure. In this example, four dissipation openings are defined in a face 2300 of a haptic housing. A first dissipation opening 2301, a second dissipation opening 2302, and third dissipation opening 2303, and a fourth dissipation opening 2304 are each defined in the face 2300 of the haptic housing and each opening has a circular shape. The size of each dissipation opening 2301-2304 may be smaller than the size of a dissipation opening in other examples (see FIG. 22). Multiple smaller openings may be defined in a haptic housing so that the total dissipation opening volume of a haptic housing has an ideal value.

Figure 24:
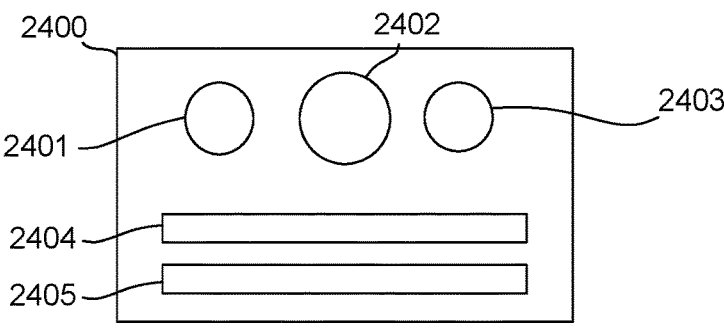
FIG. 24 depicts an example of dissipation openings in accordance with the disclosure.

FIG. 24 depicts an example of dissipation openings in accordance with the disclosure. In this example, a face 2400 of a haptic housing includes dissipation openings with different shapes and sizes. A first dissipation opening 2401 and a second dissipation opening 2403 have identical circular shapes and sizes. The first dissipation opening 2401 and second dissipation opening 2403 are on either side of a third dissipation opening 2402 with a circular shape and larger size. A fourth dissipation opening 2404 and fifth dissipation opening 2405 have rectangular shapes and identical sizes. The fourth dissipation opening 2404 and fifth dissipation opening 2405 are located on a different side of the face 2400 compared to the first, second, and third dissipation openings 2401, 2402, 2403.

Figure 25:
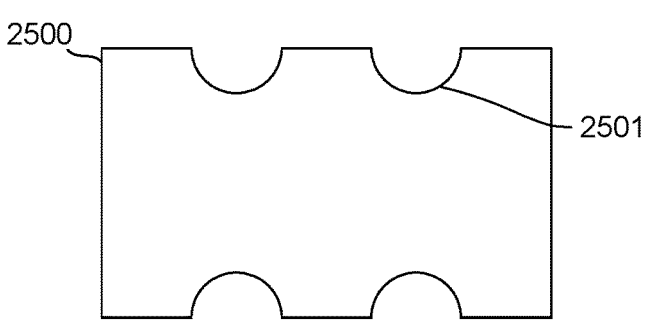
FIG. 25 depicts an example of dissipation openings in accordance with the disclosure.
Figure 26:
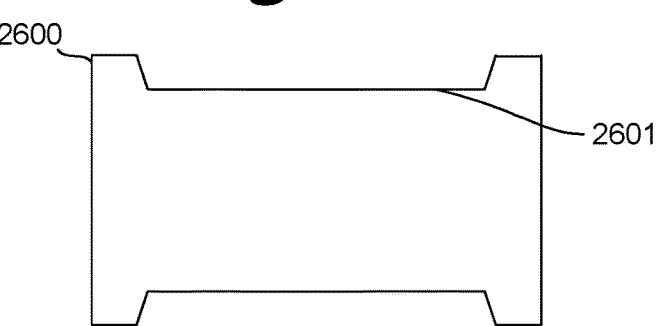
FIG. 26 depicts an example of dissipation openings in accordance with the disclosure.
Figure 27:
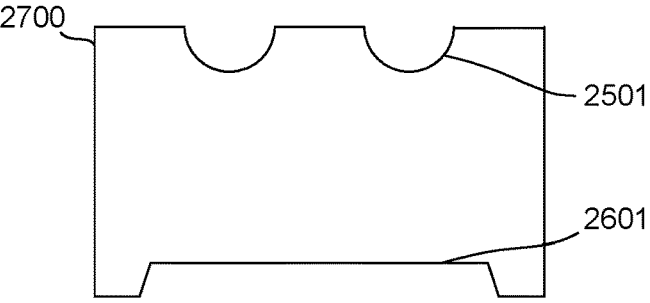
FIG. 27 depicts an example of dissipation openings in accordance with the disclosure.
Figure 28:
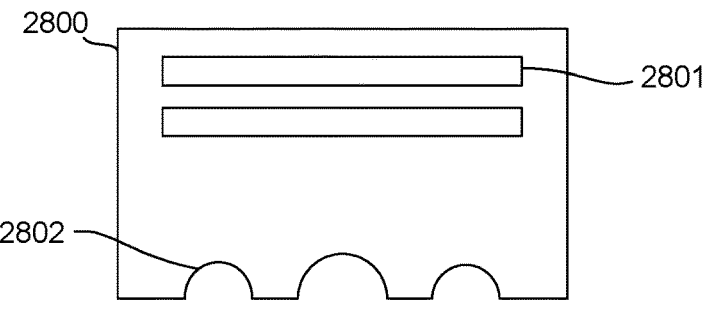
FIG. 28 depicts an example of dissipation openings in accordance with the disclosure.

In some examples, dissipation openings may be channels defined in a face of a haptic housing that are surrounded by the material of the haptic housing's face. (See FIGS. 21-24). In other examples, dissipation openings may be grooves defined in a face of a haptic housing. FIGS. 25-27 depict examples of dissipation openings defined as grooves, and FIG. 28 depicts an example of a haptic face that includes both dissipation openings as through passages and grooves used together.

FIG. 25 depicts an example of dissipation grooves in accordance with the disclosure. In this example, a face 2500 of a haptic housing includes four dissipation openings 2501. The dissipation openings 2501 are grooves in the edge of the face 2500. The dissipation openings 2501 may have a semi-circular shape. Each of the dissipation openings 2501 may have an identical or different volume and/or cross-sectional area.

FIG. 26 depicts an example of dissipation grooves in accordance with the disclosure. In this example, a face 2600 of a haptic housing includes two dissipation openings 2601. The dissipation openings 2601 are grooves on the top and bottom edge of the housing face 2600. Each of the two dissipation openings 2601 has a rectangular shape. A dissipation opening in the shape of a rectangular groove may permit more air flow than a dissipation opening with a different shaped groove, and rectangular grooves may be simpler to manufacture.

FIG. 27 depicts an example of dissipation grooves in accordance with the disclosure. In this example, a face 2700 of a haptic housing includes dissipation openings as circular grooves and rectangular grooves. The dissipation openings 2501 are defined on a top edge of the face 2700, and the dissipation openings 2601 are defined on a bottom edge of the face 2700.

FIG. 28 depicts an example of dissipation through passages and grooves in accordance with the disclosure. In this example, a face 2800 of a haptic housing includes dissipation openings as through passages defined in the material of the face and grooves defined in the edge of the face. Dissipation openings 2801 are defined in one portion of the haptic housing face 2800. The dissipation openings 2801 may be two openings with a rectangular shape.

Dissipation grooves 2802 may be defined in another portion of the haptic housing face 2800. The dissipation grooves 2802 may be three semi-circular grooves defined in the material of the housing face 2800.

Figure 29A:
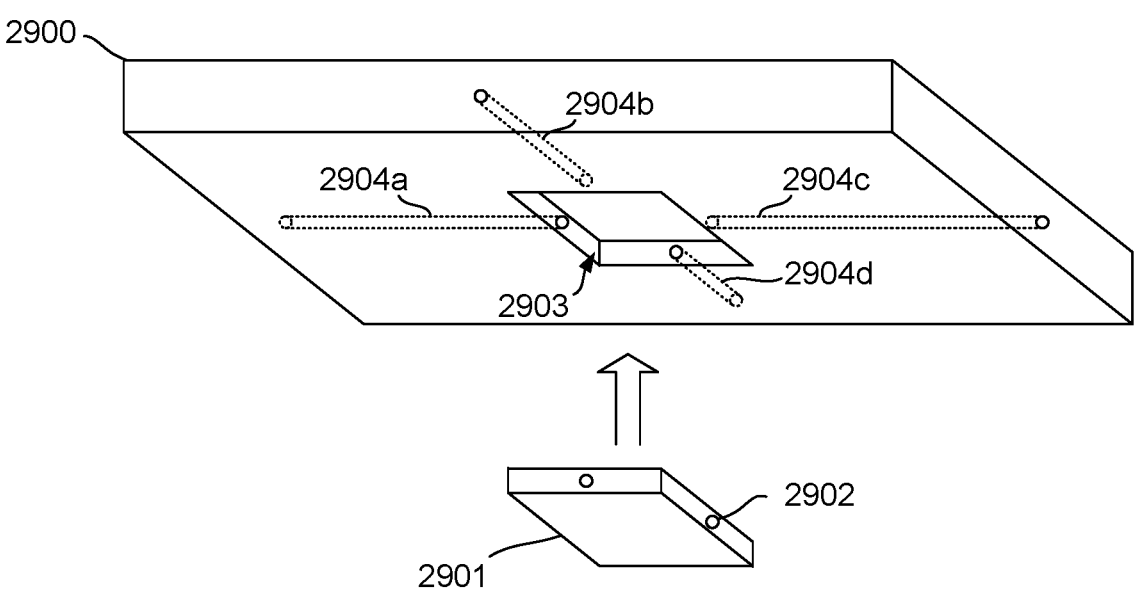
FIG. 29*a* depicts an example of a substrate in accordance with the disclosure.

FIG. 29a depicts an example of a substrate 2900 in accordance with the disclosure. In this example, the substrate 2900 includes a cavity 2903. A haptic housing 2901 may be embedded within the substrate 2900 via the cavity 2903. In this case, the cavity 2903 may be positioned in a center portion of the substrate. The cavity 2903 may be in a position such that material of the substrate 2900 surrounds all but one face of the cavity. In such an example, dissipation channels may be defined in a substrate in order to permit air flow from dissipation openings in a haptic housing to the outside of a substrate.

In this example, a first dissipation channel 2904a, second dissipation channel 2904b, third dissipation channel 2904c, and fourth dissipation channel 2904d may be defined throughout the material of the substrate 2900. The dissipation channels 2904a-d may be defined in the material of the substrate 2900 such that they connect the inside of the cavity 2903 to the outside of the substrate.

The haptic housing 2901 may include dissipation openings 2902. The dissipation openings may each be an opening with a circular shape defined in one face of the material of the haptic housing 2901. The dissipation openings 2902 and dissipation channels 2904a-d may be located such that they overlap with each other once the haptic housing 2901 has been embedded within the substrate 2900. By defining dissipation channels in the material of the substrate, the location of a cavity within a substrate may be placed anywhere within the material of the substrate, not just on edge portions of the substrate.

Figure 29B:
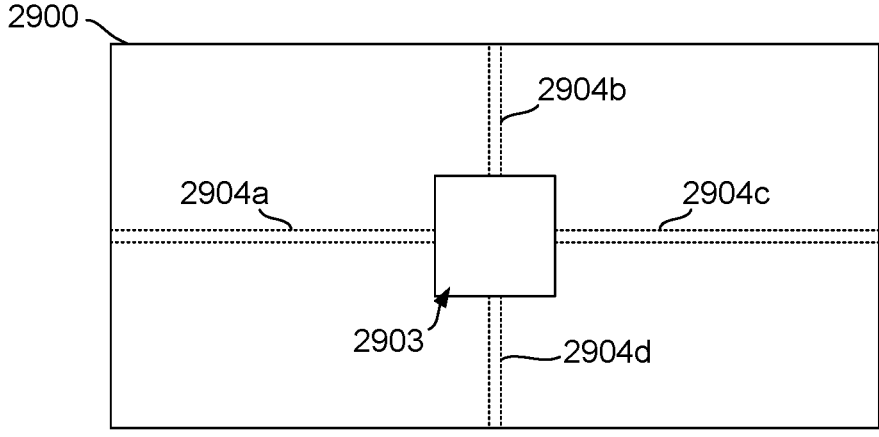
FIG. 29*b* depicts an example of a substrate in accordance with the disclosure.

For illustrative purposes, FIG. 29b depicts the substrate 2900 from a bottom-up view. The cavity 2903 may be located in a middle portion of the material of the substrate 2900. The first dissipation channel 2904a may be defined from the cavity 2903 to one edge of the substrate 2900. The second dissipation channel 2904b may be defined from the cavity 2903 to another edge of the substrate 2900. The third dissipation channel 2904c may be defined from the cavity 2903 to another edge of the substrate 2900. The fourth dissipation channel may be defined from the cavity 2903 to yet another edge of the substrate 2900.

While this example depicts a substrate 2900 with a single identified cavity 2903, in other examples a substrate may include more cavities. For example, a substrate may include two cavities, three cavities, four cavities, a different number of cavities, or combinations thereof. In some examples, each cavity may be used to embed a haptic housing in the substrate. In other examples, only some cavities in a substrate may be used to embed a haptic housing.

While this example depicts a cavity 2903 with four dissipation channels 2904a-d, in other examples, a cavity may include a different number of dissipation channels. For example, a cavity may include more or less dissipation channels than the number depicted in FIGS. 29a and 29b. A cavity may include one dissipation channel, two dissipation channels, six dissipation channels, another number of dissipation channels, or combinations thereof.

Figure 30:
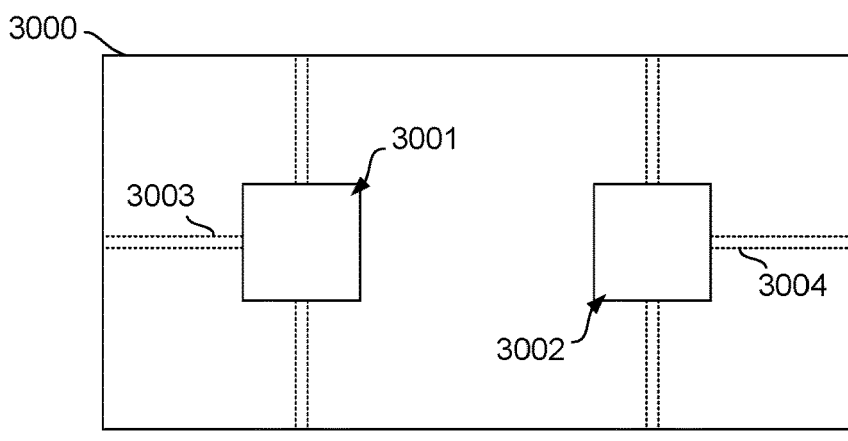
FIG. 30 depicts an example of a substrate in accordance with the disclosure.
Figure 31:
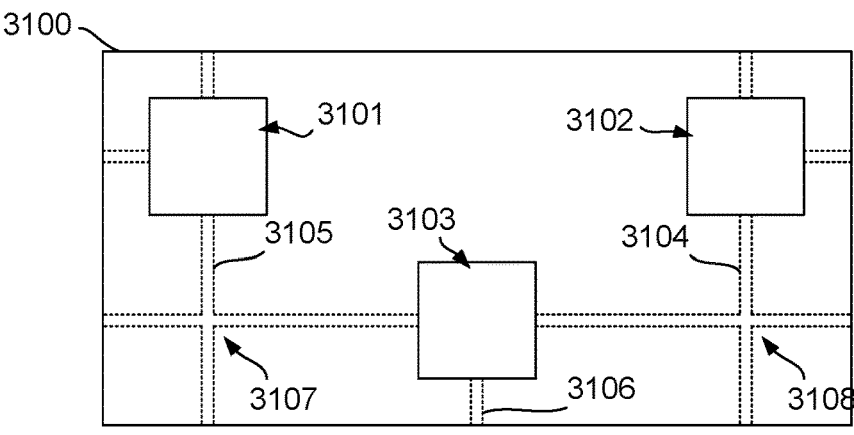
FIG. 31 depicts an example of a substrate in accordance with the disclosure.
Figure 32:
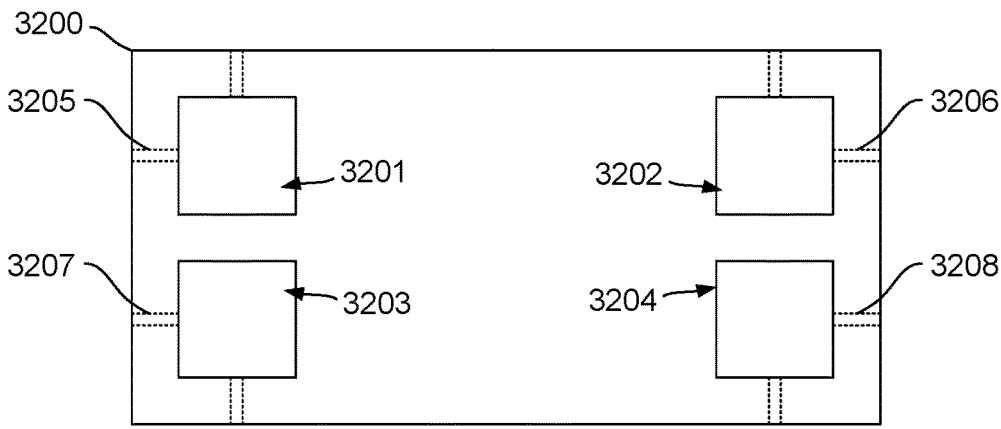
FIG. 32 depicts an example of a substrate in accordance with the disclosure.

FIGS. 30-32 depict different examples of substrates with cavities and dissipation channels. In FIG. 30 a substrate 3000 includes a first cavity 3001 and a second cavity 3002. The first cavity 3001 may include a first set 3003 of dissipation channels which connect the cavity to the outside of the substrate. The second cavity 3002 may include a second set 3004 of dissipation channels which connect the second cavity to the outside of the substrate 3000.

In FIG. 31, a substrate 3100 includes a first cavity 3101, a second cavity 3102, and a third cavity 3103. The first cavity 3101 may include a first set 3105 of dissipation channels. The second cavity 3102 may include a second set 3104 of dissipation channels. The third cavity 3103 may include a third set 3106 of dissipation channels. Dissipation channels may also intersect each other. Dissipation channels from the first set 3105 and third set 3106 may intersect each other at a first intersection 3107. Dissipation channels from the second set 3104 and third set 3106 may intersect each other at a second intersection 3108.

In FIG. 32, a substrate 3200 includes a first cavity 3201, a second cavity 3202, a third cavity 3203, and a fourth cavity 3204. The first cavity may include a first set 3205 of dissipation channels. The second cavity may include a second set 3206 of dissipation channels. The third cavity 3203 may include a third set 3207 of dissipation channels. The fourth cavity 3204 may include a fourth set 3208 of dissipation channels.

Figure 33A:
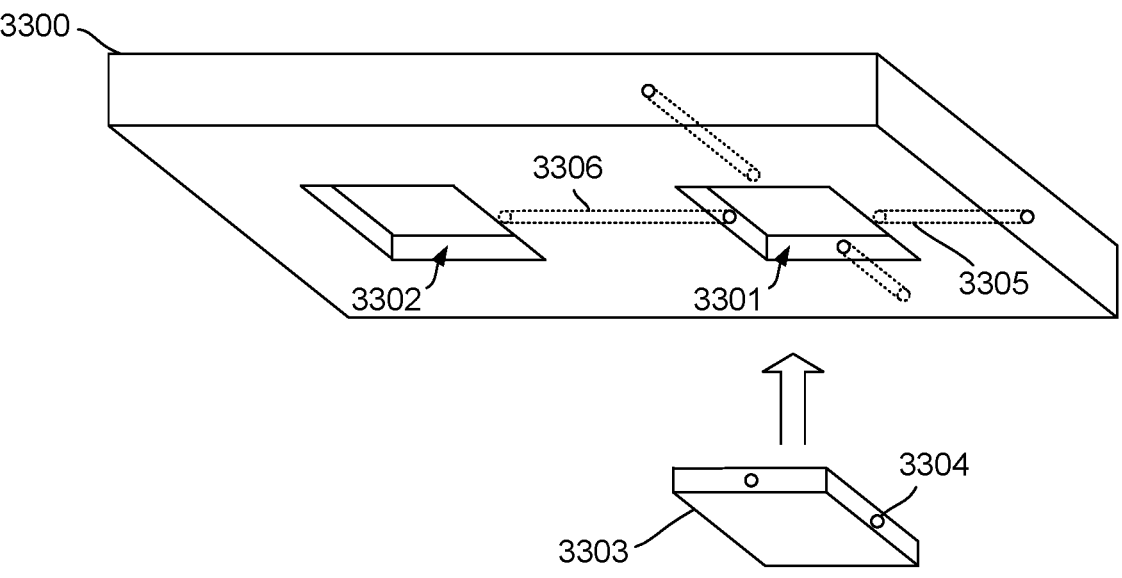
FIG. 33*a* depicts an example of a substrate in accordance with the disclosure.

FIG. 33a depicts an example of a substrate 3300 in accordance with the disclosure. In this example, the sub-strate includes a first cavity 3301 and a second cavity 3302. The first cavity includes a set 3305 of dissipation channels that connect the inside of the cavity to the outside of the substrate 3300. The first cavity 3301 also includes a dissipation channel 3306 that connects the inside of the first cavity to the inside of the second cavity 3302.

A haptic housing 3303 may be embedded within the first cavity. The haptic housing 3303 may include dissipation openings 3304 that overlap with the dissipation channels in the set 3305 and the dissipation channel 3306 which connects the first and second cavities 3301,3302 in the substrate 3300.

Including a second cavity 3302 may reduce the manufacturing complexity of dissipation channels in the substrate 3300. Including multiple cavities to dissipate air may also increase the effectiveness of air dissipation because dissipation channels may be shorter. The longer a dissipation channel, the less effectively air may flow through the channel. Connecting shorter dissipation channels to other cavities in a substrate may minimize this issue.

Figure 33B:
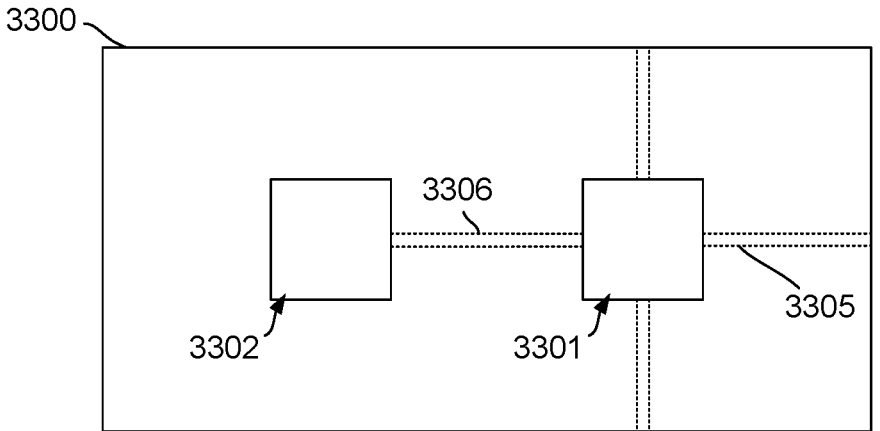
FIG. 33*b* depicts an example of a substrate in accordance with the disclosure.

For illustrative purposes, FIG. 33b depicts the substrate 3300 from the bottom-up. The substrate 3300 includes the first cavity 3301 defined in a right portion of the material of the substrate, and the second cavity 3302 defined in a left portion of the material of the substrate. The first cavity 3301 and the second cavity 3302 are connected by the dissipation channel 3306. The other dissipation channels in the set 3305 of dissipation channels connect the interior of the first cavity 3301 to the outside of the substrate 3300.

Figure 34:
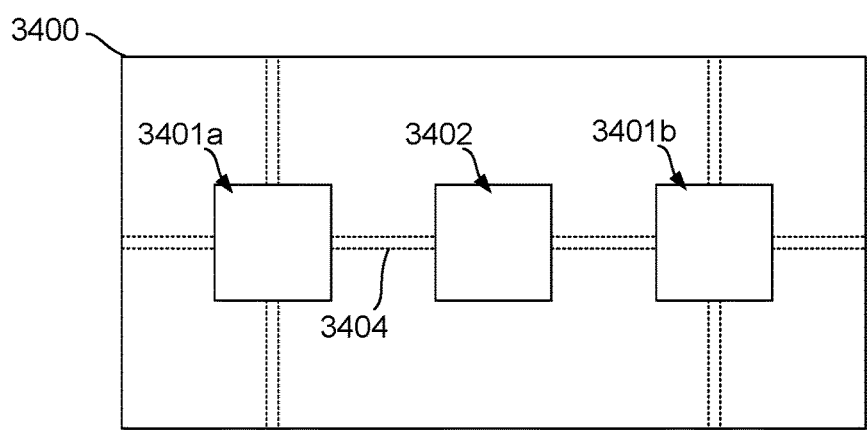
FIG. 34 depicts an example of a substrate in accordance with the disclosure.
Figure 35:
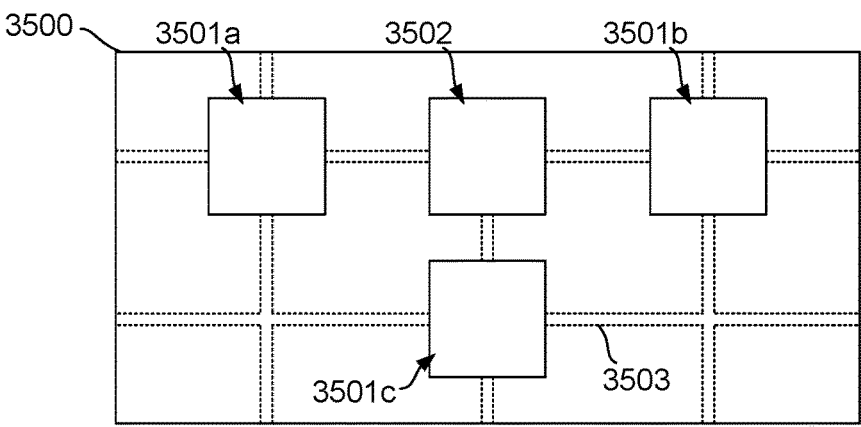
FIG. 35 depicts an example of a substrate in accordance with the disclosure.
Figure 36:
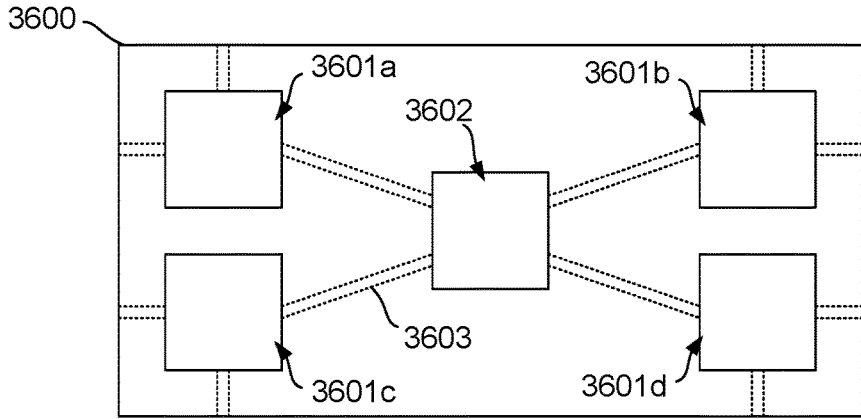
FIG. 36 depicts an example of a substrate in accordance with the disclosure.

FIGS. 34-36 depict examples of substrates with multiple cavities. FIG. 34 depicts an example of a substrate 3400 with a first cavity 3401a and a second cavity 3401b. A haptic housing may be embedded in the first cavity 3401a and the second cavity 3401b. The first cavity 3401a and the second cavity 3401b may be connected a third cavity 3402 by a set 3404 of dissipation channels. Dissipation channels in the set 3404 of dissipation channels may connect the inside of the first cavity 3401a, second cavity 3401b, and third cavity 3402 to each other and the outside of the substrate 3400.

FIG. 35 depicts an example of a substrate 3500 with a first cavity 3501a, second cavity 3501b, and third cavity 3501c connected to a fourth cavity 3502 with a set 3503 of dissipation channels. A haptic housing may be embedded in the first, second, and third cavities 3501a-c.

FIG. 36 depicts an example of a substrate 3600 with a first cavity 3601a, a second cavity 3601b, a third cavity 3601c, and a fourth cavity 3601d connected to a fifth cavity 3602 with a set 3603 of dissipation channels. A haptic housing may be embedded in the first, second, third, and fourth cavities 3601a-d.

It should be noted that the methods, systems, and devices discussed above are intended merely to be examples. It must be stressed that various embodiments may omit, substitute, or add various procedures or components as appropriate. For instance, it should be appreciated that, in alternative embodiments, the methods may be performed in an order different from that described, and that various steps may be added, omitted, or combined. Also, features described with respect to certain embodiments may be combined in various other embodiments. Different aspects and elements of the embodiments may be combined in a similar manner. Also, it should be emphasized that technology evolves and, thus, many of the elements are exemplary in nature and should not be interpreted to limit the scope of the invention.

Specific details are given in the description to provide a thorough understanding of the embodiments. However, it will be understood by one of ordinary skill in the art that the embodiments may be practiced without these specific details. For example, well-known circuits, processes, algorithms, structures, and techniques have been shown without unnecessary detail in order to avoid obscuring the embodiments.

Also, it is noted that the embodiments may be described as a process which is depicted as a flow diagram or block diagram. Although each may describe the operations as a sequential process, many of the operations can be performed in parallel or concurrently. In addition, the order of the operations may be rearranged. A process may have additional steps not included in the figure.

Having described several embodiments, it will be recognized by those of skill in the art that various modifications, alternative constructions, and equivalents may be used without departing from the spirit of the invention. For example, the above elements may merely be a component of a larger system, wherein other rules may take precedence over or otherwise modify the application of the invention. Also, a number of steps may be undertaken before, during, or after the above elements are considered. Accordingly, the above description should not be taken as limiting the scope of the invention.

The invention claimed is:

1. An apparatus, comprising:
a substrate;
a first cavity defined in a material of the substrate;
a haptic actuator within the first cavity; and
a dissipation opening defined in the material of the substrate that increases air flow between the haptic actuator in the first cavity and outside of the substrate.

2. The apparatus of claim 1, wherein the apparatus is a capacitance module.

3. The apparatus of claim 2, wherein the substrate is comprised within a layer of the capacitance module.

4. The apparatus of claim 1, wherein the substrate is attached to a rigid structure of a capacitance module.

5. The apparatus of claim 1, wherein the haptic actuator is configured to generate a haptic vibration such that the haptic vibration vibrates throughout the material of the substrate.

6. The apparatus of claim 5, wherein the air flowing through the dissipation opening has an effect of reducing pressure in the substrate.

7. The apparatus of claim 6, wherein the reducing pressure in the substrate has an effect of increasing an amplitude of the haptic vibration.

8. The apparatus of claim 1, wherein the dissipation opening connects the first cavity to an outside surface of the substrate.

9. The apparatus of claim 8, wherein the dissipation opening is an open channel in an edge of the substrate.

10. The apparatus of claim 1, wherein the dissipation opening comprises a through passage in a thickness of the substrate.

11. The apparatus of claim 1, further comprising a second cavity defined in the material of the substrate, wherein the dissipation opening connects the first cavity to the second cavity.

12. An apparatus, comprising:
a substrate in a capacitance module;
a first cavity in the substrate;
a first housing in the first cavity;
a haptic actuator in the first housing; and
a dissipation opening defined in the first housing that increases air flow from the haptic actuator in the first cavity to the outside of the apparatus.

13. The apparatus of claim 12, wherein the increasing air flow has an effect of increasing an amplitude of a vibration from the haptic actuator.

14. The apparatus of claim 12, further comprising a second cavity in the substrate, wherein the dissipation opening connects the first cavity to the second cavity.

15. The apparatus of claim 12, wherein the dissipation opening connects the first cavity to another substrate in the capacitance module.

16. The apparatus of claim 12, wherein the substrate is a component layer in the capacitance module.

17. The apparatus of claim 12, wherein the substrate is a shield layer in the capacitance module.

18. An apparatus, comprising:
a substrate;
a cavity defined in a material of the substrate;
a haptic actuator within the cavity; and
a dissipation opening defined in the material of the substrate that increases air flow from the haptic actuator in the cavity and outside of the substrate.

19. The apparatus of claim 18, wherein the haptic actuator is a piezoelectric actuator.

* * * * *